US012564044B2

(12) United States Patent
Lee et al.

(10) Patent No.: US 12,564,044 B2
(45) Date of Patent: Feb. 24, 2026

(54) NON-VOLATILE MEMORY DEVICE, METHOD FOR FABRICATING THE SAME AND ELECTRONIC SYSTEM INCLUDING THE SAME

(71) Applicant: Samsung Electronics Co., Ltd., Suwon-si (KR)

(72) Inventors: Sangsoo Lee, Suwon-si (KR); Hyung Joon Kim, Suwon-si (KR); Eunhyun Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 287 days.

(21) Appl. No.: 18/363,000

(22) Filed: Aug. 1, 2023

(65) Prior Publication Data

US 2024/0222275 A1    Jul. 4, 2024

(30) Foreign Application Priority Data

Dec. 30, 2022    (KR) ........................ 10-2022-0191007

(51) Int. Cl.
H10B 43/35        (2023.01)
H01L 23/522        (2006.01)
(Continued)

(52) U.S. Cl.
CPC ...... H01L 23/5283 (2013.01); H01L 23/5226 (2013.01); H01L 25/0652 (2013.01);
(Continued)

(58) Field of Classification Search
CPC ............. H01L 23/5283; H01L 23/5226; H01L 25/0652; H01L 2225/06506; H01L 23/53266; H01L 23/535; H01L 23/528;
H01L 29/41775; H01L 29/42324; H01L
29/4234; H01L 21/02532; H01L
21/02636; H01L 21/31111; H01L
21/31155; H01L 21/76802; H01L
21/76877; H01L 21/76897; H01L
29/40114; H01L 29/40117; H01L
29/66545; H01L 29/7883; H01L
21/76831; H01L 21/76805; H01L 29/78;
H10B 41/10; H10B 41/35; H10B 41/40;
H10B 43/10; H10B 43/35; H10B 43/40;
H10B 80/00; H10B 43/50; H10B 41/50;
H10B 20/40–65; H10B 53/20; H10B
41/20–27; H10B 43/20–27; H10B 51/20;
H10B 63/84–845; H10B 10/00–18; H10B
12/00–50; H10B 12/05–056; H10B
20/00–10; H10B 20/27–50; H10B 69/00;
H10B 41/30;
(Continued)

(56) References Cited

U.S. PATENT DOCUMENTS 9,960,181 B1    5/2018    Cui et al.
10,283,566 B2    5/2019    Sel et al.
(Continued)

*Primary Examiner* — Moin M Rahman
(74) *Attorney, Agent, or Firm* — Harness, Dickey & Pierce, P.L.C.

(57)        ABSTRACT

Non-volatile memory devices, methods for fabricating the same, and/or electronic systems including the same may be provided. A non-volatile memory device may include a substrate, a gate electrode layer, an electrode pad, a channel structure, a vertical through contact, and a separation insulation pattern.

20 Claims, 18 Drawing Sheets

(51) Int. Cl.

| | |
|---|---|
| *H01L 23/528* | (2006.01) |
| *H01L 25/065* | (2023.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/40* | (2023.01) |
| *H10B 80/00* | (2023.01) |

(52) U.S. Cl.

CPC ............. *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10B 80/00* (2023.02); *H01L 2225/06506* (2013.01)

(58) Field of Classification Search

CPC ........ H10B 43/30; H10D 88/01; H10D 88/00; H10D 88/101; H10D 84/983–988; G11C 11/41–419; G11C 11/401–4099; G11C 14/0009–0045; G11C 2211/4016; G11C 17/10–126; G11C 16/02

See application file for complete search history.

(56) References Cited

U.S. PATENT DOCUMENTS

| | | | |
|---|---|---|---|
| 10,886,289 B2 | 1/2021 | Kang et al. | |
| 10,991,717 B2 | 4/2021 | Baek | |
| 11,127,655 B2 | 9/2021 | Moriyama et al. | |
| 2021/0193672 A1 | 6/2021 | Kim et al. | |
| 2021/0202519 A1* | 7/2021 | Ku ........................ | H10B 43/50 |

* cited by examiner

FIG. 6

NON-VOLATILE MEMORY DEVICE, METHOD FOR FABRICATING THE SAME AND ELECTRONIC SYSTEM INCLUDING THE SAME

CROSS-REFERENCE TO RELATED APPLICATION

This application claims priority to and the benefit of Korean Patent Application No. 10-2022-0191007 filed in the Korean Intellectual Property Office on Dec. 30, 2022, the entire contents of which are incorporated herein by reference.

BACKGROUND

1. Field of the Disclosure

The disclosure relates to non-volatile memory devices, methods for fabricating the same, and/or electronic systems including the same.

2. Description of the Related Art

In an electronic system that requires data storage, a semiconductor device capable of storing high-capacity data is required. Accordingly, a method capable of increasing the data storage capacity of the semiconductor device is being researched. For example, as one of the methods for increasing the data storage capacity of the semiconductor device, a semiconductor device including three-dimensionally arranged memory cells instead of two-dimensionally arranged memory cells has been proposed.

SUMMARY

Some example embodiments of the present disclosure provide non-volatile memory devices including three-dimensionally arranged memory cells.

Some example embodiments of the present disclosure provide methods for fabricating a non-volatile memory device.

Some example embodiments of the present disclosure provide electronic systems including a non-volatile memory device.

According to an example embodiment, a non-volatile memory device may include gate electrode layers spaced apart from each other on a substrate along a direction perpendicular to an upper surface of the substrate and stacked in a stair shape, the gate electrode layers including a first gate electrode layer and a second gate electrode layer under the first gate electrode layer, electrode pads connected to ends of the gate electrode layers, the electrode pads including a first electrode pad connected to the first gate electrode layer, a channel structure penetrating the gate electrode layers, a first vertical through contact electrically connected to the first electrode pad by penetrating the first electrode pad connected to the first gate electrode layer and penetrating the second gate electrode layer, and a separation insulation pattern including a first portion and a second portion, the first portion interposed between the first vertical through contact and a portion of a first sidewall of the first electrode pad such that the first vertical through contact and the first electrode pad are electrically connected with each other, the second portion interposed between the first vertical through contact and a second sidewall of the second gate electrode layer to electrically insulate the first vertical through contact from the second gate electrode layer, wherein a height of a contact portion where the first electrode pad contacts the first vertical through contact less than a height of the first electrode pad.

Each of the electrodes pad may be thicker than a corresponding one of the gate electrode layers that is connected thereto.

The first electrode pad may include an inner protruding portion on a sidewall thereof facing the first vertical through contact, the inner protruding portion protruding in a direction parallel to the upper surface of the substrate toward a sidewall of the first vertical through contact.

The separation insulation pattern may be on at least one of an upper surface or a lower surface of the inner protruding portion of the first electrode pad.

The separation insulation pattern may include a first separation insulation pattern on an upper surface of the inner protruding portion of the first electrode pad, and a second separation insulation pattern on a lower surface of the inner protruding portion of the first electrode pad.

The separation insulation pattern may include a silicon oxide.

The non-volatile memory device may further include a blocking pattern covering an upper surface, a lower surface, and at least a part of a sidewall of each of the gate electrode layers and each of the electrode pads. The blocking pattern may not be on the sidewall of the first electrode pad facing the first vertical through contact and may be on the sidewall of the second gate electrode layer facing the first vertical through contact.

A first width of the second portion of the separation insulation pattern in a direction parallel to the upper surface of the substrate may be greater than a first height of the second gate electrode layer in the direction perpendicular to the upper surface of the substrate.

An upper end of the first vertical through contact is not connected to a wire, and a bottom end of the first vertical through contact is connected to a peripheral circuit pattern underneath.

The non-volatile memory device may further include a peripheral circuit pattern formed in a cell array area and an extension area, the cell array area and the extension area being side by side in a direction parallel to the upper surface of the substrate, a lower filled insulation layer covering the peripheral circuit pattern, a common source plate in the cell array area and on the lower filled insulation layer, and a base insulation layer in the extension area and on the lower filled insulation layer.

The gate electrode layers may overlap at least a part of the common source plate in the direction perpendicular to the upper surface of the substrate.

The first vertical through contact may be electrically connected to the peripheral circuit pattern by penetrating the base insulation layer and the lower filled insulation layer.

The channel structure may include a semiconductor pattern, a filled insulating pattern filling inside the semiconductor pattern, and a data storage pattern surrounding a part of a side wall of the semiconductor pattern.

The common source plate may penetrate at least a part of the data storage pattern to be in contact with a sidewall of the semiconductor pattern.

According to an example embodiment, a method for fabricating a non-volatile memory device may include forming a mold structure by alternately stacking a sacrificial layer and an interlayer insulating layer along a first direction perpendicular to an upper surface of a substrate on a cell array area and an extension area, the cell array area and the extension area being side by side in a second direction parallel to the upper surface of the substrate, the mold structure including a plurality of sacrificial layers, forming a stair structure by performing a trimming process on the mold structure, forming additional sacrificial layers on corresponding ones of a plurality of sacrificial layers included in the mold structure that are exposed by the stair structure, forming a channel structure penetrating the mold structure in the cell array area, forming a first hole penetrating a first additional sacrificial layer from among the additional sacrificial layers, and a second sacrificial layer under the first additional sacrificial layer from among the sacrificial layers, partially removing the sacrificial layer and the additional sacrificial layer exposed by the first hole to define recesses along the second direction, the recesses including a first recess in which the sacrificial layer is exposed and a second recess in which both the additional sacrificial layer and the sacrificial layer are exposed, forming first and second sacrificial sealing layers having different etch rates in the recess so that the first sacrificial sealing layer is formed in the first recess, and the first and second sacrificial sealing layers are formed in the second recess, partially removing the first and second sacrificial sealing layers such that the first sacrificial sealing layer positioned within the first recess is removed, and the first and second sacrificial sealing layers positioned within the second recess are partially removed to form first and second sacrificial sealing patterns, forming a preliminary separation insulation pattern and a first sacrificial pattern by depositing and planarizing a separation insulation layer and a first sacrificial layer inside the first hole in which the first and second sacrificial sealing patterns are formed, replacing the first and second sacrificial sealing patterns, the sacrificial layer, and the additional sacrificial layer with a gate electrode layer and an electrode pad, and removing the first sacrificial pattern in the first hole and removing a part of the preliminary separation insulation pattern to form a separation insulation pattern in the second recess where the electrode pad exists and the first recess where the gate electrode layer exists and filling the first hole with a conductive layer to form a vertical through contact.

An etch rate of the first sacrificial sealing layer may be higher than an etch rate of the second sacrificial sealing layer.

The first sacrificial sealing layer may include silicon nitride, and the second sacrificial sealing layer may include a silicon oxynitride.

In the forming of the first and second sacrificial sealing layers, the first and second sacrificial sealing layers may be sequentially formed, and the first sacrificial sealing layer may be formed to a thickness that entirely fills the first recess.

According to an example embodiment, an electronic system may include a main substrate, a semiconductor device on the main substrate, and a controller electrically connected to the semiconductor device on the main substrate. The semiconductor device may include a non-volatile memory device including a peripheral circuit pattern, the peripheral circuit being in a cell array area and an extension area, the cell array area and the extension area being side by side in a horizontal direction on an upper surface of a substrate, and an input and output pad electrically connected to the peripheral circuit pattern of the non-volatile memory device. The non-volatile memory device may further include gate electrode layers spaced apart from each other on the substrate along a direction perpendicular to the upper surface of the substrate, which includes the peripheral circuit pattern, the gate electrode layers stacked in a stair shape, the gate electrode layers including a first gate electrode layer and a second gate electrode layer under the first electrode layer, electrode pads connected to ends of the gate electrode layers, the electrode pads including a first electrode pad connected to the first gate electrode layer, a channel structure penetrating the gate electrode layers, a first vertical through contact electrically connected to the first electrode pad by penetrating the first electrode pad connected to the first gate electrode layer, and the first vertical through contact penetrating the second gate electrode layer to be electrically connected to the peripheral circuit pattern and to be insulated from the second gate electrode layer, and a separation insulation pattern including a first portion and a second portion, the first portion interposed between the first vertical through contact and a portion of a first sidewall of the first electrode pad such that the first vertical through contact and the first electrode pad are electrically connected with each other, the second portion interposed between the first vertical through contact and a second sidewall of the second gate electrode layer to electrically insulate the first vertical through contact from the second gate electrode layer, wherein a height of a contact portion where the first electrode pad contacts the first vertical through contact is less than a height of the first electrode pad.

The non-volatile memory device may further include a lower filled insulation layer covering the peripheral circuit pattern, a common source plate in the cell array area and on the lower filled insulation layer, and a base insulation layer in the extension area and on the lower filled insulation layer. The gate electrode layers may overlap at least a part of the common source plate in a direction perpendicular to the upper surface of the substrate.

The non-volatile memory devices according to the disclosed example embodiments may have a high breakdown voltage, thereby fundamentally solving a problem caused by a low breakdown voltage of a three-dimensionally arranged high integration memory device.

BRIEF DESCRIPTION OF THE DRAWINGS

FIG. 5 to FIG. 8 are cross-sectional views showing a process of a method for fabricating a non-volatile memory device according to an example embodiment.

DETAILED DESCRIPTION

Figure 1:
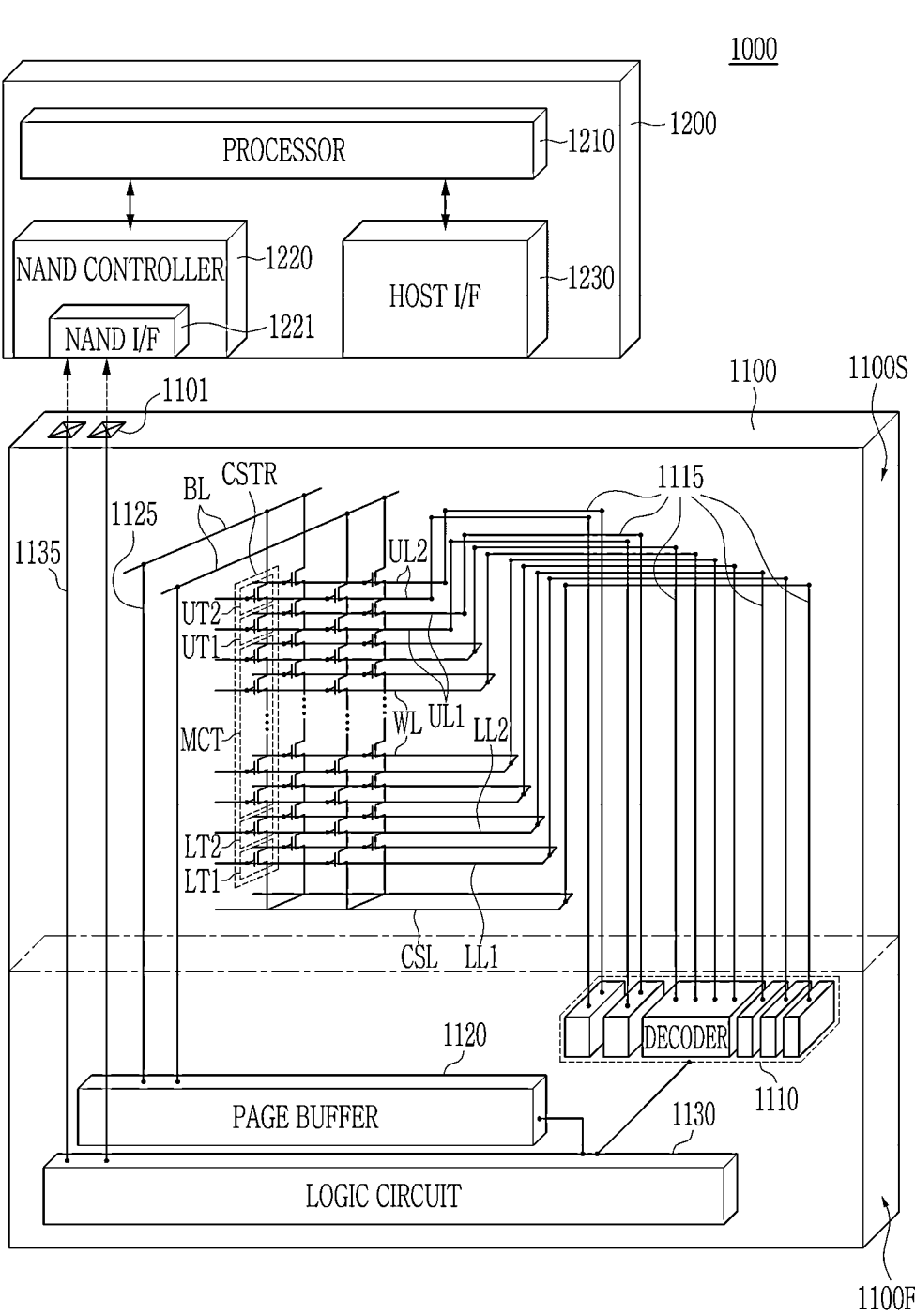
FIG. 1 is a view schematically illustrating an electronic system including a semiconductor device according to an example embodiment.

In the following detailed description, only certain example embodiments of the present disclosure have been shown and described, simply by way of illustration. As those skilled in the art would realize, the described example embodiments may be modified in various different ways, all without departing from the spirit or scope of the present disclosure.

Accordingly, the drawings and description are to be regarded as illustrative in nature and not restrictive. Like reference numerals designate like elements throughout the specification.

In addition, expressions written in the singular may be construed in the singular or plural unless an explicit expression such as "one" or "single" is used. Terms including ordinal numbers such as first, second, and the like will be used only to describe various components, and are not to be interpreted as limiting these components. These terms may be used for the purpose of distinguishing one constituent element from other constituent elements.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a view schematically illustrating an electronic system including a semiconductor device according to an example embodiment.

Referring to FIG. 1, an electronic system 1000 according to an example embodiment of the present disclosure may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid-state drive device (SSD device), a universal serial bus (USB), a computing system, a medical device, or a communication device, including one or a plurality of semiconductor devices 1100.

The semiconductor device 1100 may include a non-volatile memory device, for example, a NAND flash memory device described later with reference to FIG. 2 to FIG. 9F. The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to example embodiments.

In some example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection wires 1115 extending to the second structure 1100S in the first structure 1100F. The bit lines BL may be electrically connected to the page buffer 1120 through the second connection wires 1125 extending from the first structure 1100F to the second structure 1100S.

In the first structure 1100F, the decoder circuit 1110 and the page buffer 1120 may execute a control operation on at least one selection memory cell transistor among a plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection wire 1135 extending from the first structure 1100F to the second structure 1100S.

The controller 1200 may include a processor 1210, a NAND controller 1220, and a host interface 1230. According to some example embodiments, the electronic system 1000 may include a plurality of semiconductor devices 1100, and in this case, the controller 1200 may control a plurality of semiconductor devices 1100.

The processor 1210 may control the overall operation of the electronic system 1000 including the controller 1200. The processor 1210 may be operated according to desired (or alternatively, predetermined) firmware, and may access the semiconductor device 1100 by controlling the NAND controller 1220. The NAND controller 1220 may include a NAND interface 1221 that processes the communication with the semiconductor device 1100. Through the NAND interface 1221, a control instruction for controlling the semiconductor device 1100, data to be written to the memory cell transistors MCT of the semiconductor device 1100, data to be read from the memory cell transistors MCT of the semiconductor device 1100, etc. may be transmitted or received. The host interface 1230 may provide a communication function between the electronic system 1000 and an external host. When the control instruction is received from an external host through the host interface 1230, the processor 1210 may control the semiconductor device 1100 in response to the control instruction.

The semiconductor device according to an example embodiment of the present disclosure may include a non-volatile memory device.

The non-volatile memory device according to an example embodiment of the present disclosure may include gate electrode layers spaced apart from each other and stacked in a stair shape on a substrate along a direction perpendicular to the upper surface of the substrate, electrode pads connected to ends of the gate electrode layers, a channel structure penetrating the gate electrode layers, a first vertical through contact electrically connected to a first electrode pad by penetrating the first electrode pad connected to a first gate electrode layer, which is one of the gate electrode layers, and penetrating a second gate electrode layer disposed under the first electrode pad, and a separation insulation pattern partially interposed between the first vertical through contact and the sidewall of the first electrode pad to maintain a state in which the first vertical through contact and the first electrode pad are electrically connected, and interposed between the first vertical through contact and the sidewall of the second gate electrode layer to electrically insulate the first vertical through contact and the second gate electrode layer, and a height of a contact portion between the first electrode pad and the first vertical through contact may be lower than that of the first electrode pad.

For example, the non-volatile memory device according to an example embodiment, unlike the conventional non-volatile memory device, increases the distance between the first vertical through contact and the second gate electrode layer due to the structure in which the separation insulation pattern is included in some space between the first vertical through contact electrically connected to the first electrode pad, thereby showing an effect of increasing the breakdown voltage.

Next, the structure of the non-volatile memory device according to an example embodiment is described with reference to FIG. 2 to FIG. 4C.

Figure 2:
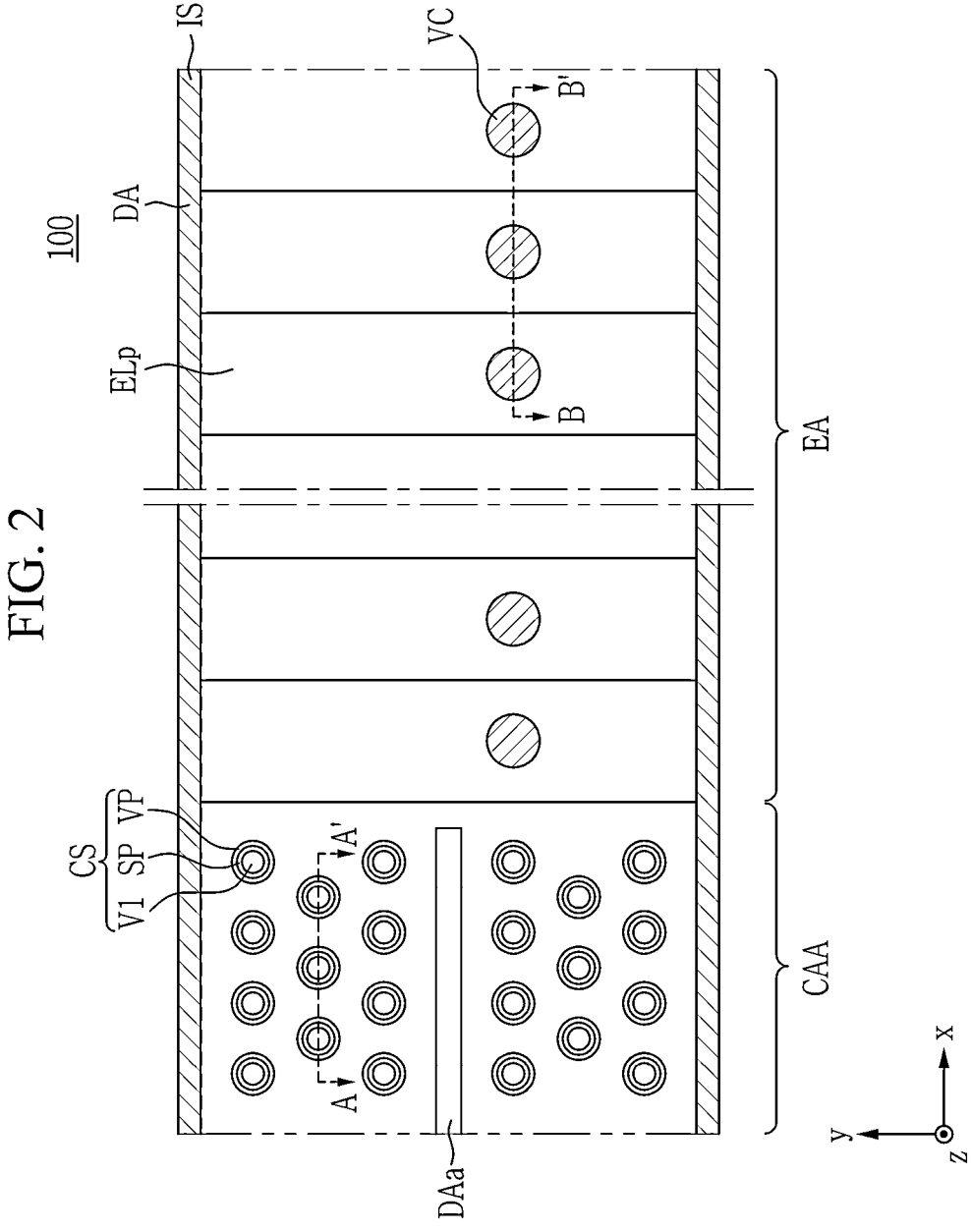
FIG. 2 is a top plan view of a non-volatile memory device according to an example embodiment.
Figure 3:
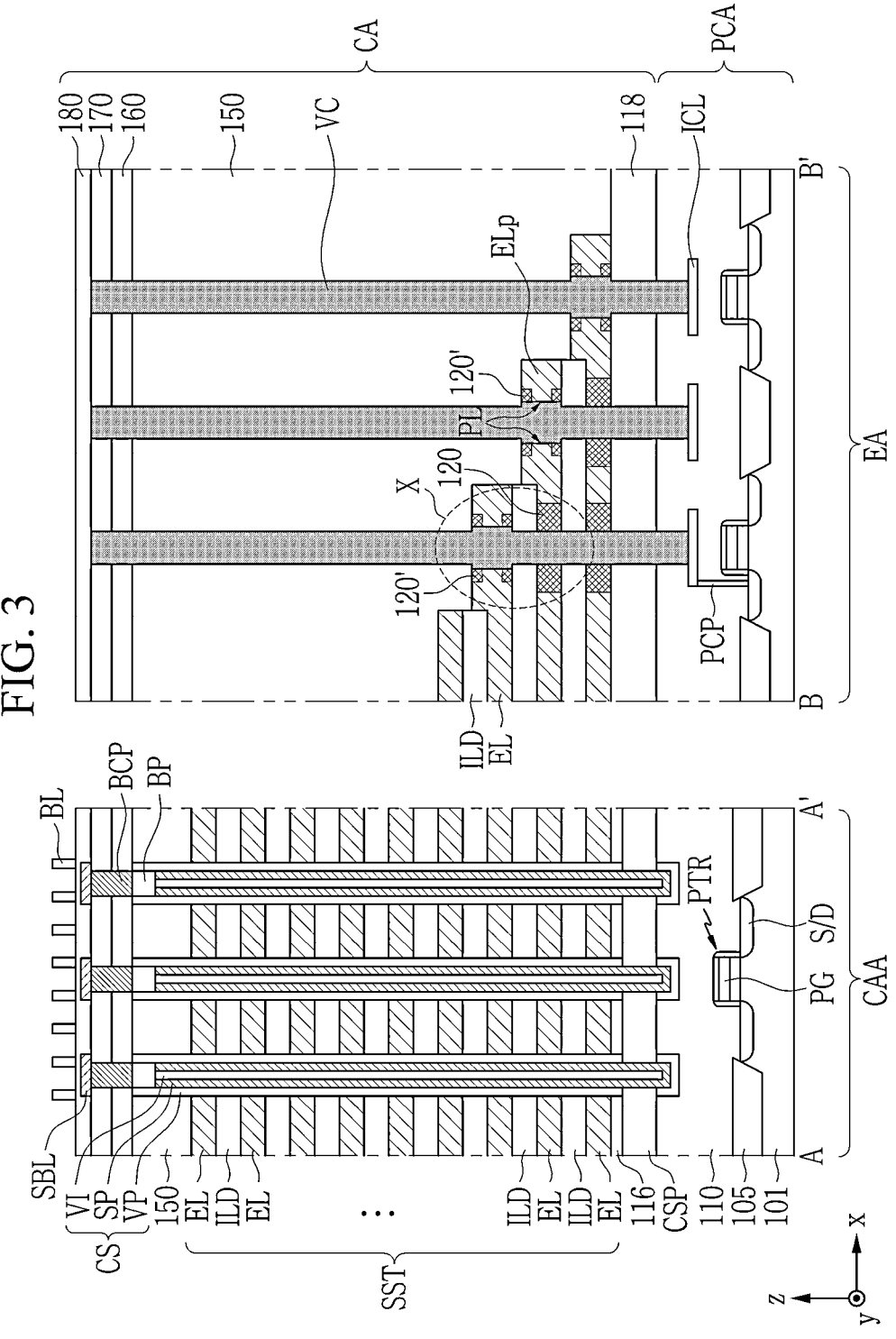
FIG. 3 is a cross-sectional view taken along lines A-A' and B-B' in FIG. 2.
Figure 4A:
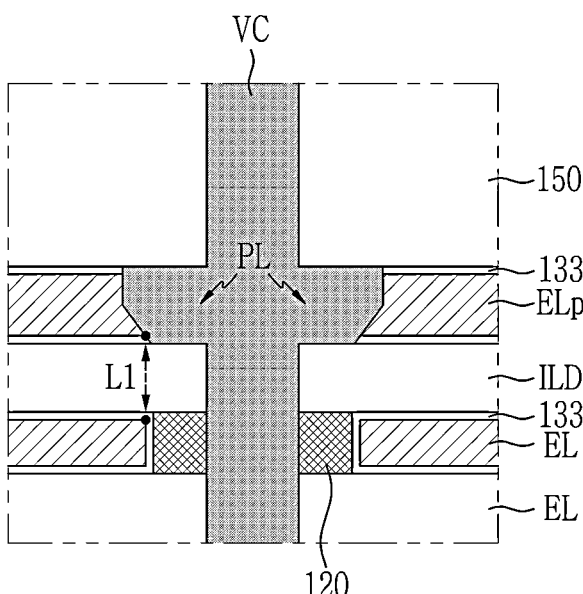
FIG. 4B is an enlarged view of an area indicated by X in FIG. 3, and FIG. 4A and FIG. 4C are cross-sectional views to show a comparative example and another example embodiment different from FIG. 4B for the same area as that of FIG. 4B, respectively.
Figure 4A:
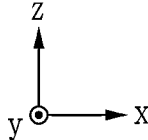
Figure 4B:
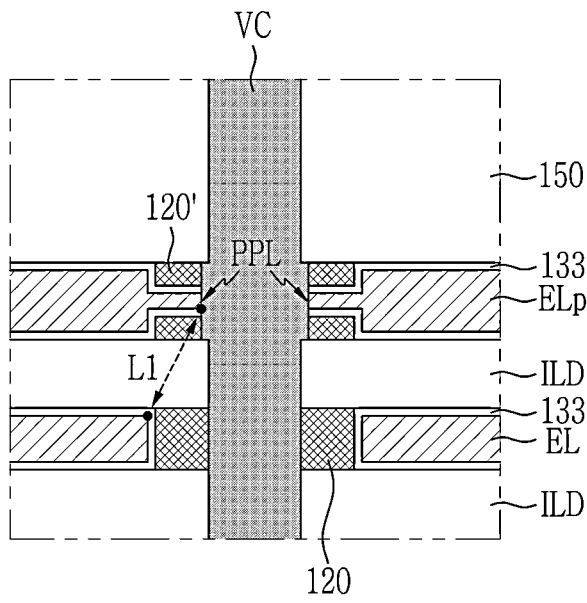
Figure 4B:
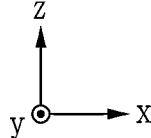
Figure 4C:
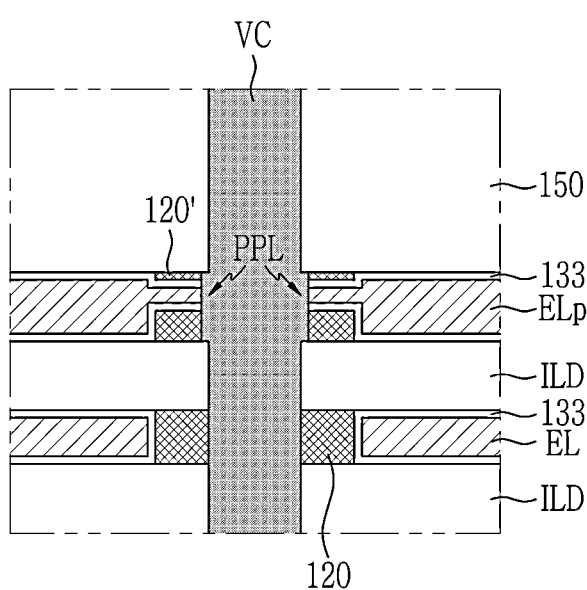
Figure 4C:
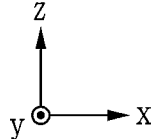

FIG. 2 is a top plan view of a non-volatile memory device according to an example embodiment, and FIG. 3 is a cross-sectional view taken along lines A-A' and B-B' in FIG. 2. FIG. 4B is an enlarged view of an area indicated by X in FIG. 3. FIG. 4A and FIG. 4C are cross-sectional views to show a comparative example and another embodiment different from FIG. 4B for the same area as that of FIG. 4B, respectively.

Referring to FIG. 2 and FIG. 3, the non-volatile memory device 100 according to an example embodiment may include a cell array area CAA and an extension area EA defined on a substrate 101. FIG. 2 is a top plan view corresponding to the upper surface of the uppermost gate electrode layer EL of the cell array area CAA of FIG. 3, and a planarization insulation layer 150 disposed in the extension area EA is omitted in FIG. 2.

In some example embodiments, the non-volatile memory device 100 may have a cell over peri (COP) structure. That is, the cell area CA may be stacked on the peripheral circuit area PCA on the substrate 101.

The peripheral circuit area PCA may be disposed on the substrate 101. The substrate 101 may include a semiconductor material, for example a group IV semiconductor, a group III-V compound semiconductor, or a group II-VI oxide semiconductor. The substrate 101 may include an n-well area doped with an N-type impurity and a p-well area doped with a P-type impurity. Active areas may be defined in the n-well area and the p-well area by an element isolation layer 105.

In the peripheral circuit area PCA, a high voltage and/or low voltage transistor PTR and passive elements such as resistors or capacitors may be disposed. Further, a peripheral circuit pattern including a peripheral circuit gate electrode PG, a source/drain area S/D, a peripheral circuit plug PCP, and a peripheral circuit wire ICL may be formed in the peripheral circuit area PCA. A lower filled insulation layer 110 covering the peripheral circuit pattern may be disposed. The lower filled insulation layer 110 may be formed of a single layer or multiple layers. Meanwhile, a PMOS transistor may be formed on the n-well area and an NMOS transistor may be formed on the p-well area.

In the cell area CA on the substrate 101, the cell array area CAA and the extension area EA may be disposed. The cell array area CAA and the extension area EA may be disposed side by side in the horizontal direction on the upper surface of the substrate 101.

The cell array area CAA may be an area where the upper transistors UT1 and UT2 including the string selection transistor, the memory cell transistors MCT, and the lower transistors LT1 and LT2 including the ground selection transistor described in FIG. 1 and collectively constituting memory cell string CSTR may be disposed. A plurality of bit lines BL may be disposed above the cell array area CAA, and impurity regions and the common source line CSL may be disposed below the cell array area CAA.

The extension area EA may be an area where an electrode pad ELp formed by extending the gate electrode layer EL of the upper transistor UT1 and UT2, the memory cell transistor MCT, and the lower transistors LT1 and LT2 in the first direction (the x direction) from the cell array area CAA is disposed. The electrode pad ELp may have a raised pad structure. Meanwhile, in the extension area EA, the gate electrode layer EL and the electrode pad ELp may have a stair structure along the first direction (the x direction). Each electrode pad ELp disposed in the stair structure can be electrically connected to the vertical through contact VC passing through it.

The stacking structure SST may be disposed on the substrate 101. The stacking structure SST may extend from the cell array area CAA on the substrate 101 to the extension area EA in the first direction (the x direction). In the cell array area CAA, a base insulating pattern 116 and a common source plate CSP may be interposed between the stacking structure SST and the peripheral circuit area PCA. That is, since the non-volatile memory device 100 according to an example embodiment has the COP structure, the gate electrode layers EL may be disposed so that at least a part thereof overlaps the common source plate CSP in a direction (a z direction) perpendicular to the substrate 101. In the extension area EA, a base insulation layer 118 may be interposed between the stacking structure SST and the peripheral circuit area PCA. However, example embodiments are not limited thereto, and between the common source plate CSP and the peripheral circuit area PCA and/or between the base insulation layer 118 and the peripheral circuit area PCA, and the peripheral circuit area PCA, a separate support layer (not shown) or a substrate (not shown) including a semiconductor material such as the semiconductor material included in the substrate 101 may be additionally interposed.

The stacking structure SST may be disposed on the base insulating pattern 116 and the base insulation layer 118. The upper surface of the base insulating pattern 116 and the upper surface of the base insulation layer 118 may be on a substantially equivalent line or level.

A plurality of stacking structures SST may be disposed on the substrate 101, and may be disposed to be spaced apart from each other along a second direction (a y direction). For example, a plurality of division area DA each extending in the first direction (the x direction) may be disposed (e.g., spaced apart) along the second direction (the y direction), and the stacking structures SST may be disposed to be spaced apart from each other through this division area DA. Here, the division area DA is also called a word line cut area, and an insulating spacer IS may be disposed therein.

As shown in FIG. 2, at least one additional division area DAa extending in the first direction (the x direction) may be disposed in the cell array area CAA between two division areas DA adjacent in the second direction (the y direction). The additional division area DAa may space the upper gate electrode layer EL serving as the string selection line SSL in the second direction (the y direction). Accordingly, the additional division area DAa is also referred to as a cell selection line SSL cut area. The additional division area DAa may contribute to more easily performing the replacement process of the gate electrode layer EL. However, according to some example embodiments, the additional division area DAa may be omitted.

The stacking structure SST may include a gate electrode layer EL and an interlayer insulating layer ILD alternately and repeatedly stacked along the third direction (the z direction) perpendicular to the upper surface of the substrate 101. The thicknesses of the gate electrode layers EL may be substantially equal to each other. The thickness of the interlayer insulating layer ILD may vary depending on the characteristics of the non-volatile memory device 100.

Also, the thickness of the interlayer insulating layer ILD may be smaller than the thickness of the gate electrode layer EL. Each gate electrode layer EL may be connected to the electrode pad ELp in the extension area EA.

A planarization insulation layer 150 may cover the substrate 101 on which the stacking structure SST is disposed. The planarization insulation layer 150 may have a substantially planarized upper surface. In addition, the planarization insulation layer 150 may cover the stair structure of the stacking structure SST or the electrode pad ELp in the extension area EA. The planarization insulation layer 150 may include one insulation layer or a plurality of insulation layers.

A plurality of channel structure CS may be disposed on the substrate 101 as a structure penetrating the stacking structure SST. The channel structure CS may be arranged in a zigzag form along the first direction (the x direction) in terms of a plane area. The channel structure CS may be disposed in the cell array area CAA. However, the arrangement position of the channel structure CS is not limited to the cell array area CAA.

The channel structure CS may include a semiconductor pattern SP, a data storage pattern VP, and a filled insulating pattern VI. In FIG. 3, the semiconductor pattern SP is shown to have a cup shape, but this is only an example, and the semiconductor pattern SP may have various shapes such as a cylinder shape, a square cylinder shape, and a filled filler shape. The semiconductor pattern SP may include, for example, semiconductor materials such as single crystalline silicon, polycrystalline silicon, organic semiconductor materials, or carbon nanostructures, but is not limited thereto.

The inside of the semiconductor pattern SP may be filled with the filled insulating pattern VI including an insulating material. The data storage pattern VP may be extended in the third direction (the z direction) and may surround the entire or a partial sidewall of the semiconductor pattern SP. The data storage pattern VP may be composed of one thin film or a plurality of thin films. In the non-volatile memory device 100 according to an example embodiment, the data storage pattern VP is a data storage layer of a NAND flash memory device and may include a tunnel insulation layer, a charge storage layer, and a blocking insulation layer.

Referring to FIG. 3, in an example embodiment, the channel structure CS may pass through the CSP and be filled in a layer lying thereunder. In addition, the CSP may pass through the data storage pattern VP and be in contact with the sidewall of the semiconductor pattern SP. Accordingly, the data storage pattern VP may be separated into an upper portion interposed between the stacking structure SST and the semiconductor pattern SP, and a lower portion interposed between a layer disposed under the CSP (e.g., the lower filled insulation layer 1100) and the semiconductor pattern SP.

A bit line electrode pad BP and a bit line contact plug BCP connected to the bit line electrode pad BP may be disposed on the semiconductor pattern SP. The side of the bit line electrode pad BP may be surrounded by the data storage pattern VP. According to some example embodiments, the bit line electrode pad BP may be positioned on the upper surface of the semiconductor pattern SP and the upper surface of the data storage pattern VP, and the side of the bit line electrode pad BP may be surrounded by a first upper interlayer insulating layer 160.

The insulating spacer IS may be interposed between a plurality of stacking structures SST, and the insulating spacer IS may constitute the division area DA.

The first upper interlayer insulating layer 160 may be disposed on the planarization insulation layer 150 in the extension area EA. In addition, the first upper interlayer insulating layer 160 may cover the upper surface of channel structures CS. A second upper interlayer insulating layer 170 may be disposed on the first upper interlayer insulating layer 160 and may cover the upper surface of the insulating spacer IS.

In the extension area EA, each of a plurality of electrode pads ELp may be penetrated by one vertical through contact VC and electrically connected to the peripheral circuit wire ICL of the peripheral circuit area PCA. For example, each of the vertical through contacts VC may pass through the first and second upper interlayer insulating layers 160 and 170 and the planarization insulation layer 150 and pass through a corresponding one of the electrode pads ELp. Also, each of the vertical through contacts VC may pass through the portions of the interlayer insulating layer ILD, the gate electrode layer EL, the base insulation layer 118, and the lower filled insulation layer 110 disposed under a corresponding one of the electrode pads ELp to be in contact with the peripheral circuit wire ICL of the peripheral circuit area PCA.

The sub-bit lines SBL may be disposed on the second upper interlayer insulating layer 170 of the cell array area CAA, and may be electrically connected to the corresponding channel structures CS through bit line contact plugs BCP. Meanwhile, in the extension area EA, because the vertical through contacts VC are already electrically connected to the lower peripheral circuit pattern, additional wires do not need to be formed on the vertical through contacts VC. Accordingly, in the non-volatile memory device 100 according to an example embodiment, a freedom degree of a layout of the upper wire may increase. A third upper interlayer insulating layer 180 may be disposed on the second upper interlayer insulating layer 170 and cover the sub-bit lines SBL. The bit lines BL may be disposed on the third upper interlayer insulating layer 180 and extend in the second direction (the y direction) across the stacking structure SST. Although not shown, the bit lines BL may be connected to the sub-bit lines SBL through a contact plug.

In the non-volatile memory device 100 of an example embodiment, one vertical through contact VC may be electrically connected to one electrode pad ELp and insulated from the rest of the gate electrode layer EL. A structure of electrically connecting the vertical through contact VC to one electrode pad ELp and insulating the rest of the gate electrode layer EL is further described in detail as follows.

As described above, in the extension area EA of the non-volatile memory device 100 of an example embodiment, as the gate electrode layer EL may have a stair structure in which the length in the first direction (the x direction) becomes shorter as the gate electrode layer EL being positioned farther from the substrate 101 in the third direction (the z direction). In addition, the electrode pad ELp connected to the gate electrode layer EL in the extension area EA may have a raised pad structure. Here, the raised pad structure may mean a structure in which the thickness of the electrode pad ELp is thicker than the thickness of the corresponding gate electrode layer EL.

Referring to FIG. 3, any one of a plurality of vertical through contacts VC may pass through a corresponding one of a plurality of electrode pads ELp, and may be in contact with the interior wall of the corresponding one of the plurality of electrode pads ELp through which it passes. Accordingly, the vertical through contact VC may be electrically connected to the electrode pad ELp and the gate electrode layer EL connected thereto.

On the other hand, the vertical through contact VC penetrates the gate electrode layer EL placed under the penetrated electrode pad ELp, but may be insulated through the separation insulation pattern 120 interposed between the vertical through contact VC and the interior wall of the gate electrode layer EL.

In this specification, any one of a plurality of vertical through contacts may be referred to as a first vertical through contact in order to distinguish it from other vertical through contacts. In addition, the electrode pad electrically connected to the first vertical through contact may be referred to as a first electrode pad, the gate electrode layer connected to the first electrode pad may be referred to as a first gate electrode layer, and the gate electrode layer electrically insulated from the first vertical through contact may be referred to as a second gate electrode layer. Therefore, a plurality of vertical through contacts may all be referred to as a first vertical through contact, and no one configuration is specified.

The width of the separation insulation pattern 120 interposed between the first vertical through contact VC and the sidewall of the second gate electrode layer EL may be greater than the height of the second gate electrode layer EL. In this case, the width of the separation insulation pattern 120 may mean the width in a direction horizontal to the substrate 101, and the height of the second gate electrode layer EL may mean the height in a direction perpendicular to the substrate 101.

As described later, the separation insulation pattern 120 may be formed by forming a separation insulation layer in a recess (referring to R3 and R4 in FIG. 9D) secured through a pull-back (P/B) process after forming a first hole H1 for forming the vertical through contact VC and etching it (referring to FIG. 9D and FIG. 9F). In this process, unless an inversion structure is formed using first and second sacrificial sealing patterns (referring to FIG. 9D and FIG. 9E, 146 and 148), even if the first vertical through contact VC and the second gate electrode layer EL are insulated with the separation insulation pattern 120, quality degradation may occur due to a low breakdown voltage.

Figure 9A:
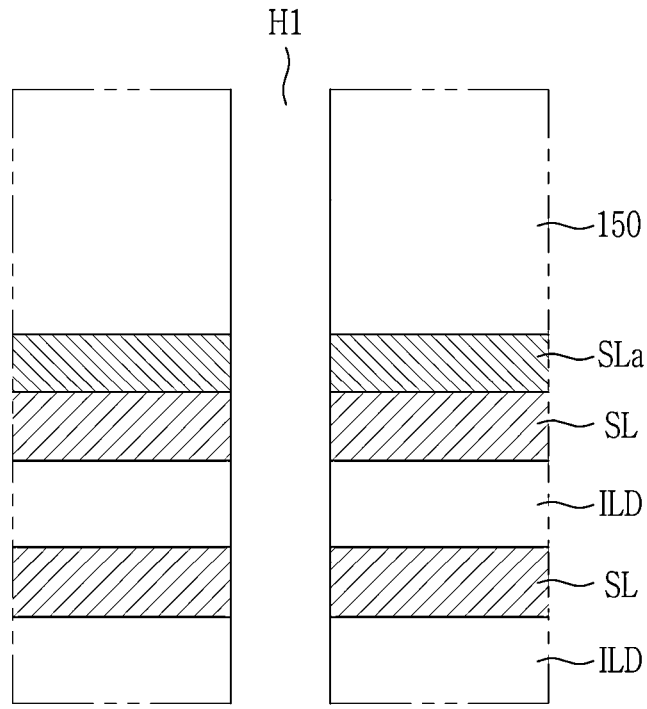
FIG. 9A is an enlarged view of an area indicated by X in FIG. 8, and FIG. 9B to FIG. 9F are cross-sectional views to explain each manufacturing step for the same area as that of FIG. 9A.
Figure 9A:
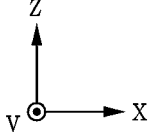
Figure 9B:
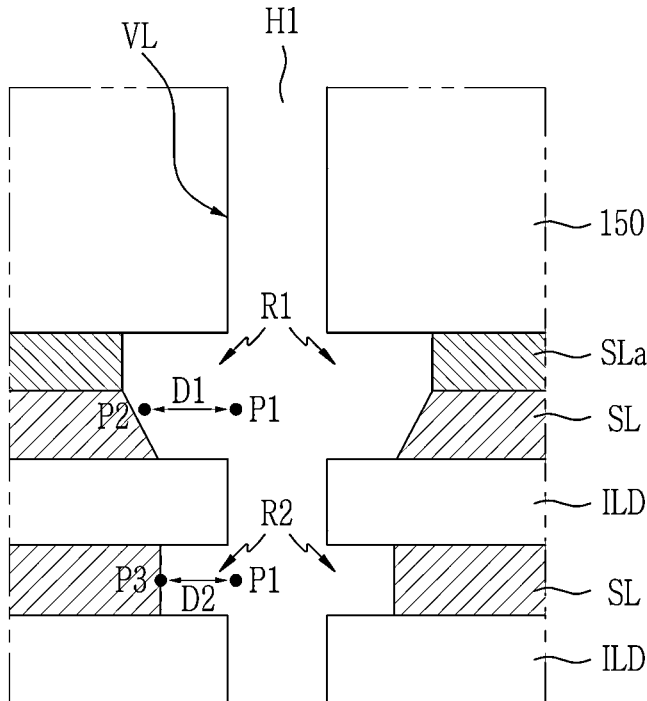
Figure 9B:
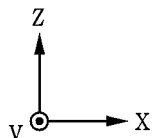

Referring to FIG. 9B in the process of forming the separation insulation pattern 120, if the first hole H1 is formed and the pull-back process is performed, a recess R1 on the side of the sacrificial pad SLp, which is an area where the electrode pad ELp is formed, is formed deeper than a recess R2 of the sacrificial layer SL, which is an area where the gate electrode layer EL is formed. In this structure, if the separation insulation pattern 120 and the vertical through contact VC are formed, like FIG. 4A. In such case regardless of whether the protruding portion PL of the first vertical through contact VC and the second gate electrode layer EL overlap in the third direction (the z direction) or do not overlap in the third direction (the z direction), a distance L1 therebetween is relatively small, so it has a low breakdown voltage.

On the other hand, if two types of sacrificial sealing layers (referring to FIG. 9C, 142 and 144) with different etch rates are used after forming the first hole H1 and performing the pull-back process, as an inversion structure, in which the depth of the recess on the sacrificial pad SLp side (see R1 in FIG. 9B) that is the area where the electrode pad ELp is formed and the depth of the recess on the sacrificial layer SL side that is the area where the gate electrode layer EL is formed (see R2 in FIG. 9B) are reversed, is formed, the distance L1 between the protruding portion PL of the first vertical through contact VC and the second gate electrode layer EL may be increased.

Figure 9C:
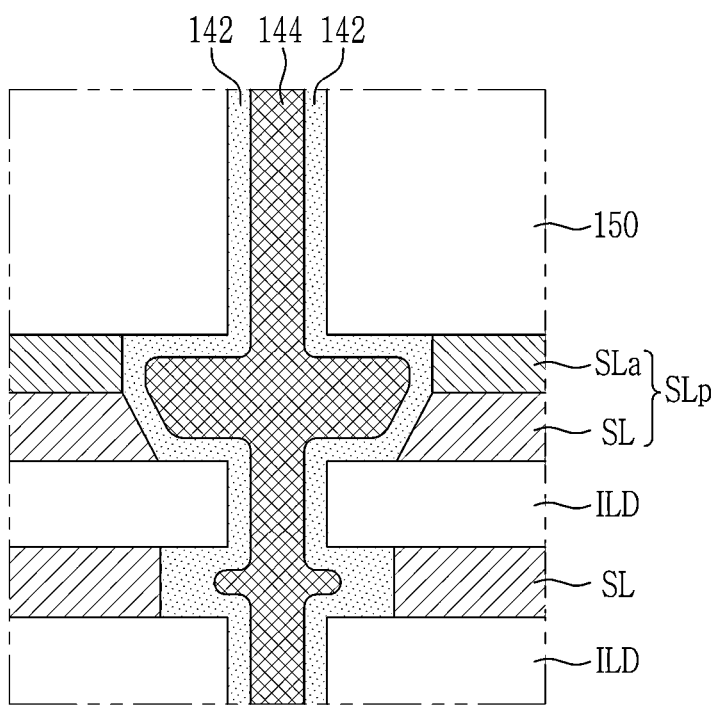
Figure 9C:
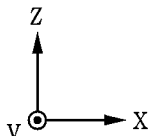
Figure 9D:
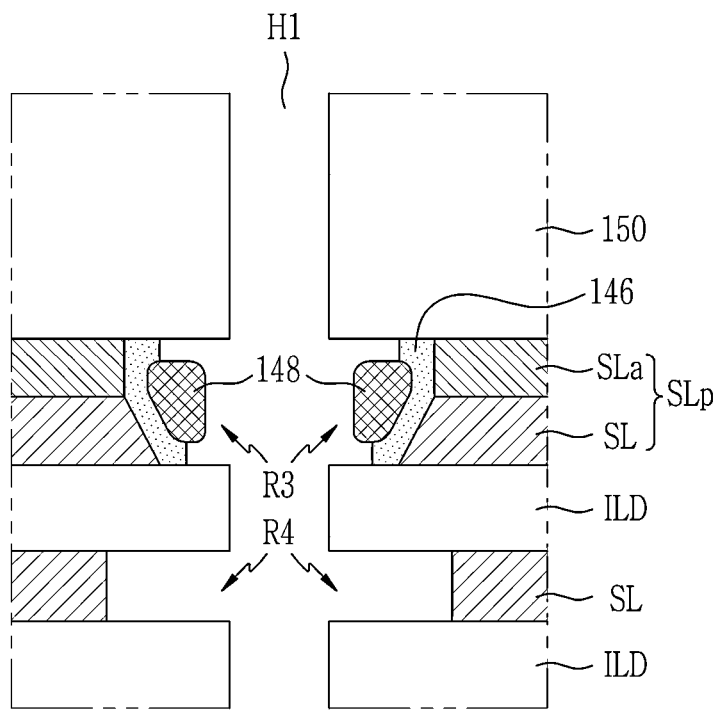
Figure 9D:
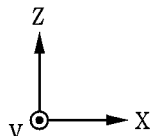

For example, referring to FIG. 9B to FIG. 9D, after forming the first hole H1 and performing the first pull-back process, while the second recess R2, which has a relatively low height, is filled with the first sacrificial sealing layer 142, which has a high etch rate, the deposit thickness of the first sacrificial sealing layer 142 may be properly controlled so that the first recess R1 having the relatively high height is filled with the first sacrificial sealing layer 142 with a high etch rate and the second sacrificial sealing layer 144 with a low etch rate. Thereafter, when a second pull-back process is performed, the second recess R2 filled with only the first sacrificial sealing layer 142 having a high etch rate may be maintained as it is or may be recessed more deeply. In addition, in the first recess R1 filled with the first and second sacrificial sealing layers 142 and 144 having different etch rates, the first and second sacrificial sealing patterns 146 and 148 resulting from the second sacrificial sealing layer 144 having a low etch rate and the first sacrificial sealing layer 142 not etched thereby may be formed. Accordingly, a reversal occurs between the depth of the recess (R3 in FIG. 9D) on the sacrificial pad SLp side, which is the area where the electrode pad ELp is formed, and the recess (R4 in FIG. 9D) on the sacrificial layer SL side, which is the area where the gate electrode layer EL is formed, compared to FIG. 9B. In this specification, such a structure in which the recess depths of the two areas are reversed is called an inversion structure.

The first and second sacrificial sealing patterns 146 and 148 are replaced with a gate electrode pad ELp in a gate electrode layer replacement process. Accordingly, the non-volatile memory device 100 of an example embodiment has a unique internal shape of the electrode pad ELp.

Referring to FIG. 4B in which the portion represented by X of FIG. 3 is enlarged, an inner protruding portion PPL protruded in a direction parallel to the upper surface of the substrate 101 toward the sidewall of the vertical through contact VC may be formed on the sidewall of the electrode pad ELp facing the vertical through contact VC. The inner protruding portion PPL of the electrode pad ELp may have a shape in which the width in a third direction (the z direction) becomes narrower toward the sidewall of the vertical through contact VC. In addition, a separation insulation pattern 120' may be disposed on the upper surface or lower surface of the inner protruding portion PPL of the electrode pad ELp in the third direction (the z direction).

In some example embodiments, the separation insulation pattern 120' is interposed in the partial space between the first vertical through contact VC and the interior wall (e.g., a portion of sidewalls) of the first electrode pad ELp, so that the portion of sidewalls of the first electrode pad ELp may be spaced apart from the first vertical through contact VC. However, because the first vertical through contact VC and the first electrode pad ELp need to be electrically connected, the first vertical through contact VC and a portion of the first electrode pad ELp may be in contact with each other, and the remaining portion of the first electrode pad ELp may be spaced apart from the first vertical through contact VC by the separation insulation pattern 120'.

The separation insulation pattern 120' in contact with the interior wall of the electrode pad ELp may be separated into the upper and lower parts by the inner protruding portion PPL of the electrode pad ELp, or may only be formed on one side of the upper surface or the lower surface of the inner protruding portion PPL of the electrode pad ELp. The upper and lower parts of the separation insulation patterns 120' separated by the inner protruding portion PPL of the electrode pad ELp may be referred to as a first separation insulation pattern 120' and a second separation insulation pattern 120', respectively. The sizes (e.g., the thickness) of the first and second separation insulation patterns 120' may be almost identical as illustrated in FIG. 4B, and may be different as illustrated in FIG. 4C.

When the separation insulation pattern 120' in contact with the electrode pad ELp interior wall is formed on the upper surface of the inner protruding portion PPL of the electrode pad ELp, there is no effect of increasing the distance L1 between the first vertical through contact VC and the second gate electrode layer EL. Therefore, in this case, when forming the first recess R1 in the sacrificial pad SLp by increasing the etch rate of the additional sacrificial layer SLa compared to the sacrificial layer SL, it may be controlled that the upper part is more recessed so that the second sacrificial sealing pattern 148 more remains on the upper part.

Referring to FIG. 4A, if there is no separation insulation pattern 120' in contact with the interior wall of the electrode pad ELp, the height of the contact portion between the electrode pad ELp and the vertical through contact VC may be substantially the same as that of the electrode pad ELp.

However, referring to FIG. 4B and FIG. 4C, when the separation insulation pattern 120' contacting the interior wall of the electrode pad ELp exists, a characteristic that the height (e.g., thickness) of the contact portion between the electrode pad ELp and the vertical through contact VC may be lower than the height (e.g., thickness) of the electrode pad ELp may appear.

Referring to FIG. 3 and FIG. 4B, a blocking pattern 133 may be formed on the upper surface, the lower surface, and some sidewalls (or at least a part of a sidewall) of each of the gate electrode layer EL and the electrode pad ELp. For example, the blocking pattern 133 may be interposed between the gate electrode layer EL and the interlayer insulating layer ILD, between the gate electrode layer EL and the base insulation layer 118, between the gate electrode layer EL and the separation insulation pattern 120, between the electrode pad ELp and the planarization insulation layer 150, between the electrode pad ELp and the interlayer insulating layer ILD, between the electrode pad ELp and the base insulation layer 118, and between the electrode pad ELp and the separation insulation pattern 120'.

In order to increase the breakdown voltage, the shortest distance L1 between (1) the point where the blocking pattern 133 covering the first electrode pad ELp ends and is in contact with the first vertical through contact VC and (2) the second gate electrode layer EL should be increased.

As an example, compared to the case where the inversion structure is not formed as shown in FIG. 4A, when the inversion structure is formed as shown in FIG. 4B, the shortest distance L1 may be lengthened by about 10 nm or more. Thus, the increasing effect of the breakdown voltage may be sufficiently exhibited.

FIG. 5 to FIG. 8 are cross-sectional views showing a process of a method for fabricating the non-volatile memory device 100 of FIG. 3. FIG. 9A is an enlarged view of an area indicated by X in FIG. 8. FIG. 9B to FIG. 9F are cross-sectional views to explain each manufacturing step for the same area as that of FIG. 9A.

Figure 5:
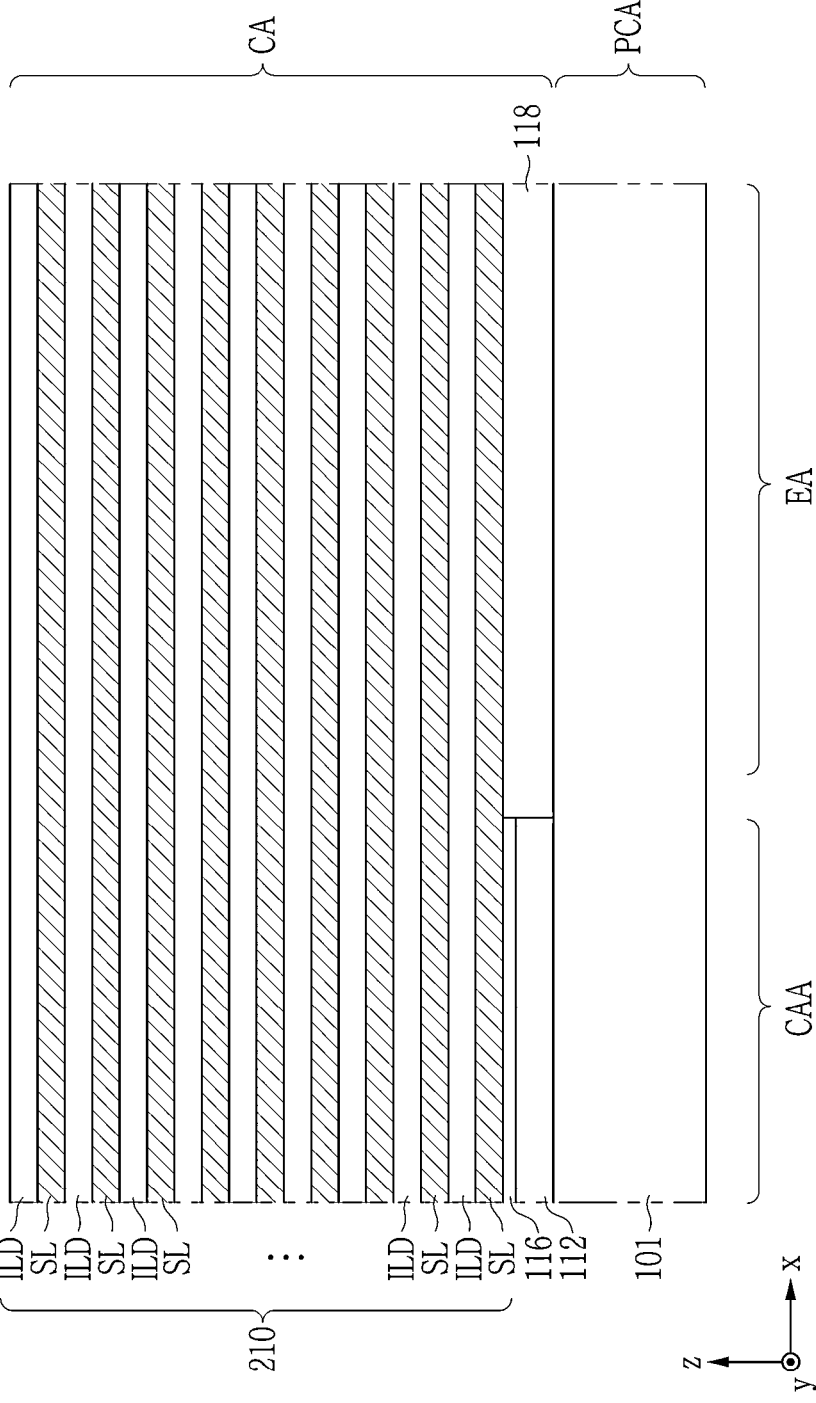

Referring to FIG. 5, a base sacrificial layer 112 may be formed in a cell array area CAA of a substrate 101 on which a peripheral circuit area PCA is formed. In FIG. 5, the configuration in the peripheral circuit area PCA is not shown, but a base sacrificial layer 112 may be formed on the lower filled insulation layer 110 of the substrate 101 on which the peripheral circuit area PCA as shown in FIG. 3 is formed. However, it is not limited thereto, and between the base sacrificial layer 112 and the lower filled insulation layer 110, a separate support layer (not shown) covering the entire area of the lower filled insulation layer 110 or a substrate including a semiconductor material such as the substrate 101 (omitted) and the like may be additionally interposed.

After that, a base insulating pattern 116 may be formed on the base sacrificial layer 112. In addition, a base insulation layer 118 covering the sidewalls of the base sacrificial layer 112 and the base insulating pattern 116 may be formed in the extension area EA of the substrate 101. In one example, the upper surfaces of the base insulating pattern 116 and the base insulation layer 118 may be positioned on a substantially equivalent plane.

The base sacrificial layer 112 may include a nitride such as a silicon nitride, and the base insulating pattern 116 and the base insulation layer 118 may include an oxide such as a silicon oxide.

Referring to FIG. 5, a mold structure 210 is formed on the substrate 101 of the cell array area CAA and the extension area EA. The mold structure 210 may include a sacrificial layer SL and an interlayer insulating layer ILD that are vertically alternately stacked. In the mold structure 210, the sacrificial layer SL may be formed of a material having etching selectivity with respect to the interlayer insulating layer ILD. For example, the sacrificial layer SL may be formed of a silicon nitride, and the interlayer insulating layer ILD may be formed of a silicon oxide. Of course, the materials of the sacrificial layer SL and the interlayer insulating layer ILD are not limited to the above materials. The sacrificial layer SL may have a substantially equivalent thickness, and the interlayer insulating layer ILD may have different thicknesses in some areas.

Figure 6:
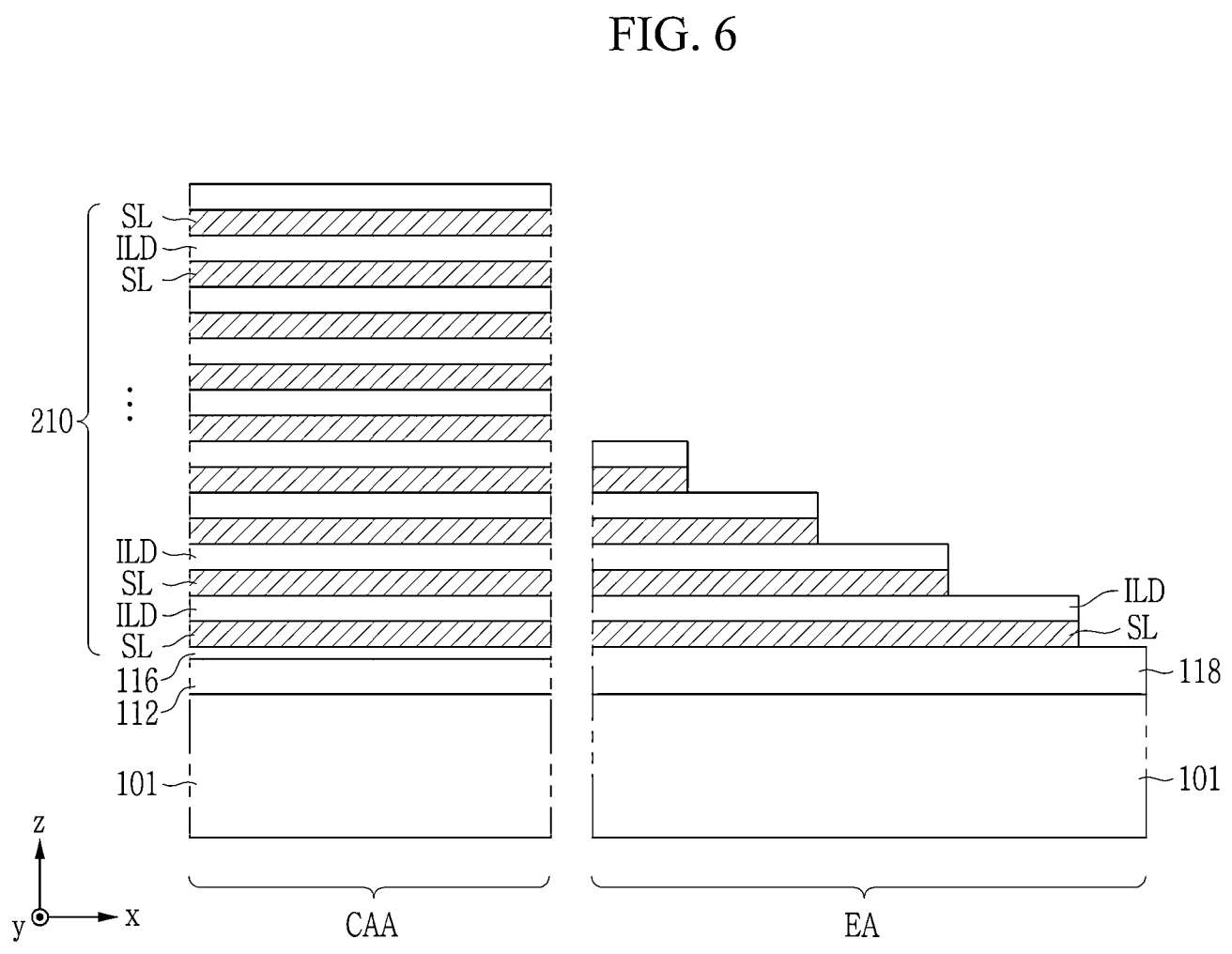

Referring to FIG. 6, a stair structure may be formed in the extension area EA by performing a trimming process on the mold structure 210. Here, the trimming process may include a process of forming a mask pattern covering the mold structure 210 in the cell array area CAA and the extension area EA, a process of etching a part of the mold structure 210, and a process of reducing the horizontal area of the mask pattern. Also, as the process of etching the part of the mold structure 210 and the process of reducing the horizontal area of the mask pattern are alternately repeated, the mold structure 210 may have the stair structure in the extension area EA. Here, the stair structure of the extension area EA may have a stair structure in which a combination of the sacrificial layer SL of one layer and the interlayer insulating layer ILD of one layer increases or decreases layer by layer.

Hereinafter, the sacrificial layer SL and the interlayer insulating layer ILD with the same length in the first direction (the x direction) are defined as one stair layer, and the part of each stair layer that is not covered by the upper stair layer and is exposed to the outside is defined as a stair.

Figure 7:
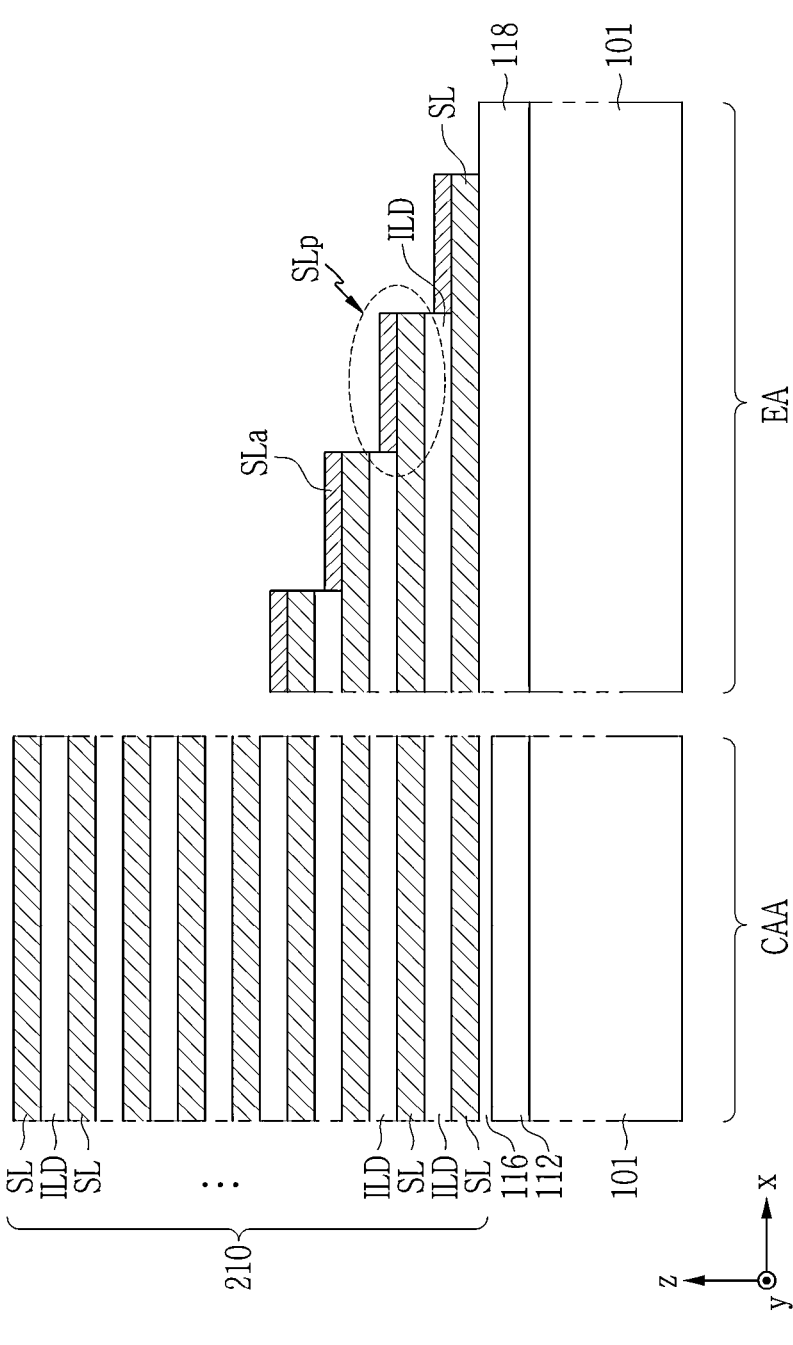

Referring to FIG. 7, the sacrificial pad SLp may be formed by increasing the thickness of the distal end of each sacrificial layer SL in the first direction (the x direction).

In one example, the sacrificial layer SL may be exposed by removing the interlayer insulating layer ILD of the stairs of the extension area EA. In addition, an additional sacrificial layer SLa may be formed on the sacrificial layer SL exposed in the stair structure. The additional sacrificial layer SLa may be formed of the same material as the sacrificial layer SL. For example, the additional sacrificial layer SLa may be formed of a silicon nitride. Of course, the material of the additional sacrificial layer SLa is not limited to a silicon nitride. On the other hand, even if the additional sacrificial layer SLa is formed of the same material as the sacrificial layer SL, the etch rate may be higher than that of the sacrificial layer SL for the same etching solution by giving a slight difference such as changing the component ratio. For example, for a phosphoric acid solution, the additional sacrificial layer SLa may be etched faster than the sacrificial layer SL. However, according to some example embodiments, the additional sacrificial layer SLa and the sacrificial layer SL may be formed of substantially the same material.

Briefly explaining the process of forming the additional sacrificial layer SLa, first, a first material film covering the mold structure 210 is deposited to be relatively thick on the entire surface of the substrate 101. The first material film may be a material film for the additional sacrificial layer SLa. After that, the first material film is thinned through wet etching. At this time, all of the first material film on the side part of the stair structure of the extension area EA may be removed. Subsequently, a photo-resist (PR) pattern covering the extension area EA is formed, and the first material film on the cell array area CAA is removed by using the PR pattern. Next, by removing the PR pattern, an additional sacrificial layer SLa may be formed on the sacrificial layer SL exposed in the stair structure of the extension area EA.

Figure 8:
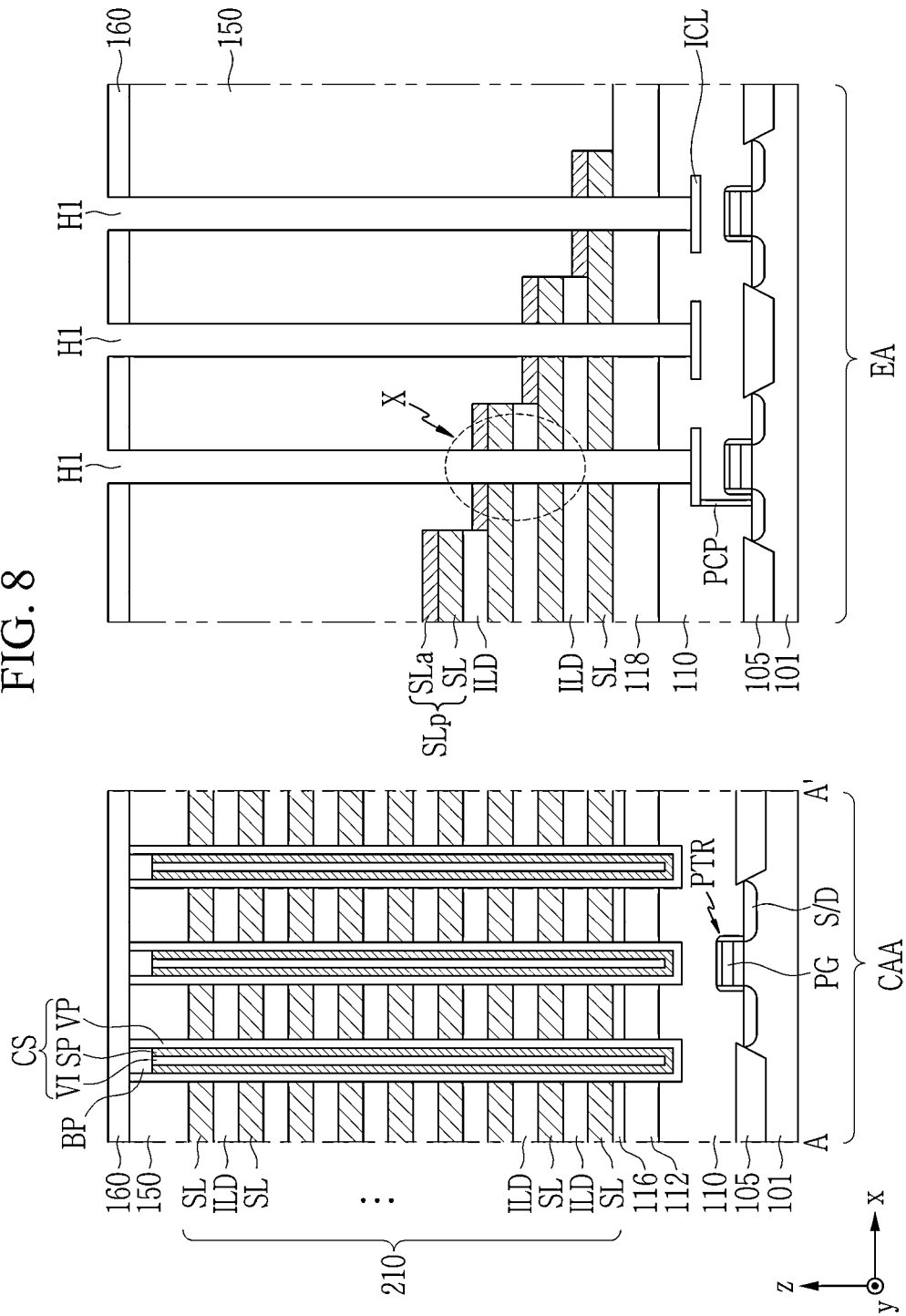

Referring to FIG. 8, a second material film covering the mold structure 210 may be deposited on the entire surface of the substrate 101, and the second material film is planarized to form a planarization insulation layer 150. The second material film may cover the mold structure 210 of the cell array area CAA, the mold structure 210 of the stair structure in the extension area EA, and the additional sacrificial layer SLa. The second material film may be formed of an insulating material, for example, an oxide. Of course, the material of the second material film is not limited to an oxide.

Thereafter, a vertical hole (not shown) passing through the mold structure 210, the base insulating pattern 116, and the base sacrificial layer 112 in the cell array area CAA is formed. The lower filled insulation layer 110 disposed under the base sacrificial layer 112 may also be partially etched by such a vertical hole (not shown). As described above, when the separate support layer (not shown) or the substrate (not shown) is additionally interposed, a portion of the support layer or the substrate may be etched by the vertical hole.

According to some example embodiments, penetration holes in the vertical direction may be formed in a shape in which a width gradually decreases from top to bottom according to characteristics of an etching process. Therefore, the vertical hole (not shown) or the first hole H1 to be described later may be formed in a shape whose width decreases from top to bottom even if it is not shown in the drawing.

After forming the vertical hole (not shown), a channel structure CS may be formed by forming the data storage pattern VP, the semiconductor pattern SP, and the filled insulating pattern VI in the vertical hole. Then, bit line electrode pads BP are formed on the semiconductor patterns SP of the channel structure CS, respectively.

In the process of forming the channel structure CS, a dummy channel structure (not shown) may be formed together in the extension area EA. For example, in the extension area EA, the vertical hole passing through the planarization insulation layer 150 and the mold structure 210 is formed. As the vertical hole being farther away from the cell array area CAA, the number of sacrificial layers SL penetrated by the vertical hole may decrease. Thereafter, the dummy channel structure is formed by forming the data storage pattern VP, the semiconductor pattern SP, and the filled insulating pattern VI in the vertical hole. According to some example embodiments, in the dummy channel structure, the semiconductor pattern SP may be removed, and the filled insulating pattern VI may be directly formed on the data storage pattern VP.

According to the non-volatile memory device 100 of an example embodiment, the first hole H1 is formed before performing the gate electrode layer replacement process and filled with the first sacrificial pattern 122 to form a pillar structure, as described below, even without a separate dummy channel structure, the mold structure in which the sacrificial layer SL and the additional sacrificial layers Sla are removed may be supported without being collapsed.

Referring to FIG. 8, a first upper interlayer insulating layer 160 covering the upper surface of the channel structure CS and the planarization insulation layer 150 is formed on the entire surface of the substrate 101. Next, in the extension area EA, after forming an etching mask pattern on the first upper interlayer insulating layer 160, the parts of the first upper interlayer insulating layer 160, the planarization insulation layer 150, each of additional sacrificial layers SLa, the sacrificial layer SL disposed under each additional sacrificial layer SLa, the interlayer insulating layer ILD, the base insulation layer 118, and the lower filled insulation layer 110 are etched to form first holes H1 exposing the upper surface of the peripheral circuit wire ICL. According to some example embodiments, the first holes H1 may have the same diameter as each other. However, when a dummy channel structure (not shown) is formed in the extension area EA, some first holes H1 may be formed with a smaller diameter than other first holes H1 in order to maintain a certain distance therebetween.

Thereafter, the additional sacrificial layers SLa and the sacrificial layers SL exposed by the first holes H1 may be partially removed through a pull-back (P/B) process. The pull-back process may be performed as a wet etching process using phosphoric acid, for example.

FIG. 9A is an enlarged cross-sectional view of a portion X of FIG. 8. FIG. 9B is a cross-sectional view showing a shape in which the additional sacrificial layers SLa and the sacrificial layers SL are partially removed after the pull-back process according to some example embodiments.

The sacrificial pad SLp may have a raised pad structure than the sacrificial layer SL. Accordingly, the recess R1 of the sacrificial pad SLp side, in which the additional sacrificial layer SLa and the sacrificial layer SL that are exposed are removed together after the pull-back process, may be larger than the recess R2 of the sacrificial layer SL side, in which only the sacrificial layer SL is removed. Thus, the depth D1 in the first direction (the x direction) of the first recess R1 on the sacrificial pad SLp side may be deeper than the depth D2 in the first direction (the x direction) of the second recess R2 on the sacrificial layer SL side.

The depths D1 and D2 of the recesses R1 and R2 mean a length in the horizontal direction from the side of the vertical portion VL of the first hole H1 to the exposed interior wall of the additional sacrificial layer SLa and a length in the horizontal direction from the side of the vertical portion VL of the first hole H1 to the sacrificial layer SL, respectively, after the pull-back process. At this time, the side of the vertical portion VL of the first hole H1, the interior wall of the exposed additional sacrificial layer SLa and sacrificial layer SL, and the interior wall of the singly exposed sacrificial layer SL may have an uneven shape in the third direction (the z direction). Therefore, the depths D1 and D2 of the recesses R1 and R2 may be understood as the distance between the average points of each position. That is, the measured position of the side of the vertical portion VL of first hole H1 is a midpoint P1 between two farthest tangents among the tangents parallel to the third direction (the z direction) contacting the interior wall of the first hole H1, the measured position of the interior wall of the exposed additional sacrificial layer SLa and the sacrificial layer SL is a midpoint P2 between two farthest tangents parallel to the third direction (the z direction) contacting the interior wall of the exposed additional sacrificial layer SLa and the sacrificial layer SL, and the measured position of the interior wall of the singly exposed sacrificial layer SL may be a midpoint P3 between two tangents farthest away from among the tangents parallel to the third direction (the z direction) contacting the interior wall of the singly exposed sacrificial layer SL.

Referring to FIG. 9B, when the etch rate of the additional sacrificial layer SLa is higher than that of the sacrificial layer SL, the additional sacrificial layer SLa may be etched faster than the sacrificial layer SL. Accordingly, the interior wall of the additional sacrificial layer SLa and the sacrificial layer SL remaining without being removed after the pull-back process may have an uneven surface in the third direction (the z direction). However, it is not limited thereto, and the additional sacrificial layer SLa and the sacrificial layer SL are formed of substantially the same material and etched with the substantially equal ratio, so the interior wall of the additional sacrificial layer SLa and the sacrificial layer SL that remain without being removed after the pull-back process may have the uniform of flat surface in the third direction (the z direction).

As shown in FIG. 9B, after the pull-back process, if the separation insulation pattern 120 of FIG. 3 is formed, and the vertical through contact VC is formed, the distance between the protruding portion PL of the first vertical through contact VC and the second gate electrode layer EL is relatively small, resulting in quality degradation due to a low break-down voltage.

Therefore, in the method for fabricating the non-volatile memory device 100 of another example embodiment, the sacrificial sealing layers 142 and 144 may be formed and the pull-back process may be again performed to form a structure in which the recess (the first recess R1 positioned in FIG. 9B) on the sacrificial pad SLp side is formed shallower compared to the recess (the second recess R2 positioned on FIG. 9B) on the sacrificial layer SL side.

Referring to FIG. 9C, the first sacrificial sealing layer 142 may be deposited on the interior wall of the first hole H1 and the interior wall of the additional sacrificial layer SLa and the sacrificial layer SL exposed through the pull-back process. At this time, the first sacrificial sealing layer 142 may be deposited so as to not completely fill the first hole H1. Thereafter, the second sacrificial sealing layer 144 may be deposited on the first sacrificial sealing layer 142 in the first hole H1.

The first sacrificial sealing layer 142 may be formed of a material with a higher etch rate compared to the second sacrificial sealing layer 144. In one example, the first sacrificial sealing layer 142 may be formed of a silicon nitride, and the second sacrificial sealing layer 144 may be a silicon oxynitride layer. In this case, the difference in the etch rate between the first sacrificial sealing layer 142 and the second sacrificial sealing layer 144 may be controlled through the ratio of nitrogen and oxygen of the silicon oxynitride layer. As an example, when the second sacrificial sealing layer 144 is formed of the silicon oxynitride layer having a nitrogen concentration of 20%, the etch rate difference of about 60% from that of the first sacrificial sealing layer 142 formed of a silicon nitride may be obtained.

Thereafter, the parts of the first and second sacrificial sealing layers 142 and 144 filled in the first holes H1 may be removed again through the pull-back process. According to some example embodiments, when the sacrificial sealing layers 142 and 144 are removed to expose the sacrificial layer SL of the mold structure, the sacrificial layer SL of the mold structure may also be removed. In the present specification, the pull-back process that removes the part of the additional sacrificial layer SLa and the sacrificial layer SL exposed according to the formation of the first hole H1 is referred to as a primary pull-back process, and the pull-back process that removes the sacrificial sealing layers 142 and 144 that fill the inside of the first hole H1 is referred to as a secondary pull-back process. The secondary pull-back process may also be performed with a wet etching process using phosphoric acid like the primary pull-back process.

Referring to FIG. 9D, in the secondary pull-back process, the first sacrificial sealing layer 142, which has a high etch rate, may be etched at a faster speed than the second sacrificial sealing layer 144. Considering this point, if the deposit thickness of the first sacrificial sealing layer 142 is properly controlled so that the second recess R2 having the relatively low height is fully filled by the first sacrificial sealing layer 142, and the first recess R1 having the relatively high height is filled with the first sacrificial sealing layer 142 and the second sacrificial sealing layer 144 together, the residues of the sacrificial sealing layer 142 and 144 may be left only in the first recess R1. For example, in the first recess R1, the first sacrificial sealing layer 142 is etched and then the first sacrificial sealing pattern 146 remains, and the second sacrificial sealing layer 144 is etched and then the second sacrificial sealing pattern 148 remains, allowing a new third recess R3 to be formed. In addition, all of the first sacrificial sealing layer 142 in the second recess R2 is removed and the second recess R2 may be restored, or the part of the sacrificial layer SL of the mold structure re-exposed after all of the first sacrificial sealing layer 142 is removed in the secondary pull-back process may be further removed so that a fourth recess deeper than the second recess R2 is formed.

As described above, the second sacrificial sealing layer 144 has a lower etch rate than the first sacrificial sealing layer 142. Accordingly, the second sacrificial sealing pattern 148 remaining after the second sacrificial sealing layer 144 is etched may be formed in a shape protruded from the interior wall of the sacrificial pad SLp to the first hole H1 side. That is, the second sacrificial sealing pattern 148 may have a shape protruded in a horizontal direction, which is parallel to the upper surface of the substrate, from the interior wall of the sacrificial pad SLp. The additional sacrificial layer SLa, the sacrificial layer SL, and the first and second sacrificial sealing patterns 146 and 148 of the sacrificial pad SLp are replaced with a conductive layer in the gate electrode layer replacement process of the subsequent process, so the unique internal shape of the aforementioned electrode pad ELp is due to the unique shape of the second sacrificial sealing pattern 148.

Figure 9E:
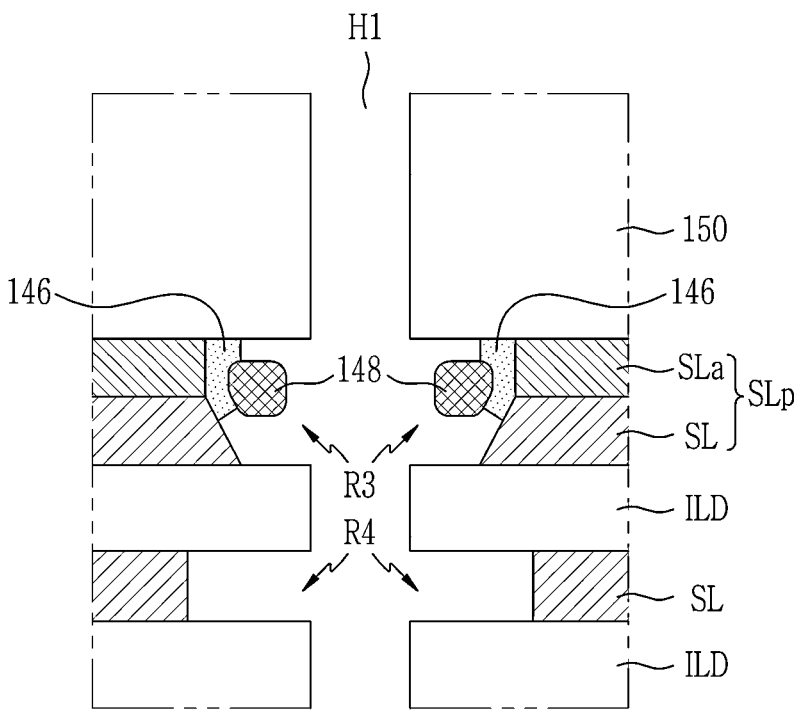
Figure 9E:
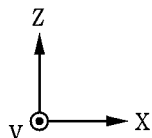

According to some example embodiments, as shown in FIG. 9E, the second sacrificial sealing pattern 148 may be biased in one direction of the interlayer insulating layer ILD and the planarization insulation layer 150. Alternatively, the second sacrificial sealing pattern 148 may be formed to be in contact with one of the interlayer insulating layer ILD and the planarization insulation layer 150. In this case, according to some example embodiments, the first sacrificial sealing layer 142 not covered by the second sacrificial sealing pattern 148 may be removed to expose the sacrificial layer SL of the mold structure in the third recess R3.

After the secondary pull-back process, the recess (the fourth recess R4 in FIG. 9D) on the sacrificial layer SL side has a deeper structure than the recess (the third recess R3 in FIG. 9D) on the sacrificial pad SLp side. According to the secondary pull-back process, the depth of the recess on the sacrificial pad SLp side and the recess on the sacrificial layer SL side are reversed, thereby an inversion structure like in FIG. 9D is formed.

Unlike the above-described, the inversion structure may be formed even when the sacrificial sealing layer is configured as a single layer. However, when using a material with an etch rate that is too high compared to the sacrificial layer SL as the single-layered sacrificial sealing layer, the sacrificial sealing layer remains on the sacrificial layer SL side, and in the gate electrode layer replacement process of the subsequent process, the second gate electrode layer EL may be even closer to the protruding portion of the first vertical through contact VC that is disposed directly thereon. On the other hand, in a case of using a material with a small difference in etch rate from the sacrificial layer SL as the single-layered sacrificial sealing layer, the inversion degree of the inversion structure is insignificant, thereby it is impossible to realize the desired effect of increasing the breakdown voltage.

After forming the inversion structure in which the recess (e.g., R3 in FIG. 9D) on the sacrificial pad SLp side is shallower than the recess (e.g., R4 in FIG. 9D) on the sacrificial layer SL side, a separation insulation layer (not shown) may be conformally formed on the first upper interlayer insulating layer 160, the interior wall of the first hole H1, the lower surface of the planarization insulation layer 150 exposed by the first hole H1, the exposed surface of the first and second sacrificial sealing patterns 146 and 148, the upper surface, the sidewall, the lower surface of the interlayer insulating layer ILD, and the sidewall of the sacrificial layer SL. Next, after forming a first sacrificial layer (not shown) filling the first hole H1 on the separation insulation layer (not shown), the separation insulation layer (not shown) and the first sacrificial layer (not shown) may be planarized until the upper surface of the first upper interlayer insulating layer 160 is exposed. Accordingly, as shown in FIG. 9F, a preliminary separation insulation pattern 121 and a first sacrificial pattern 122 may be formed inside the first hole H1.

The preliminary separation insulation pattern 121 may be formed of a material having etch selectivity with respect to the sacrificial layer SL, for example, an oxide such as a silicon oxide. The first sacrificial pattern 122 may include, for example, polysilicon.

Figure 9F:
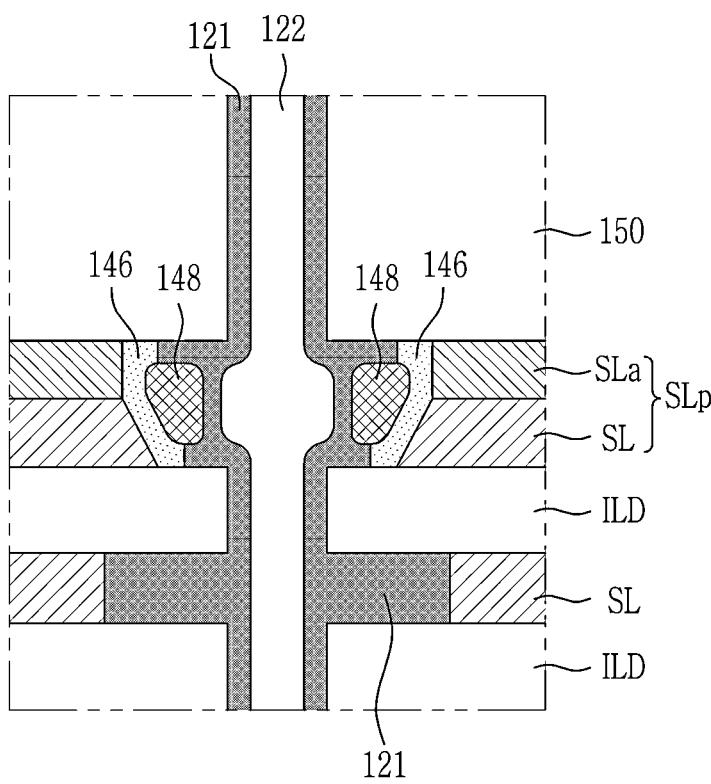
Figure 9F:
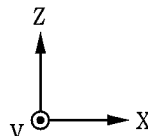

Referring to FIG. 9F, the preliminary separation insulation pattern 121 fills the gap in the third direction (the z direction) between the planarization insulation layer 150 and the second sacrificial sealing pattern 148, and the gap between the second sacrificial sealing pattern 148 and the upper surface of the underlying interlayer insulating layer ILD. The preliminary separation insulation pattern 121 that fills the gap remains without being removed in the subsequent process and may serve to increase the distance between the protruding portion PL of the first vertical through contact VC and the second gate electrode layer EL.

Next, a first opening penetrating the first upper interlayer insulating layer 160, the planarization insulation layer 150, and the mold structure 210 may be formed in the cell array area CAA and the extension area EA of the substrate 101.

The first opening may have a line shape that extends in the first direction (the x direction), and may be disposed to be spaced apart in the second direction (the y direction). The first opening may be disposed away from the channel structure CS and expose the sidewall of the sacrificial layer SL and the interlayer insulating layer ILD of the mold structure 210. In addition, the first opening may expose the sidewall of the additional sacrificial layer SLa disposed on top of the stair structure in the extension area EA. Through the first opening, the cell array area CAA and the extension area EA may be separated into a block unit. On the other hand, when forming the first opening, at least one additional second opening extending in the first direction (the x direction) may be formed in the cell array area CAA. An additional division area (DAa in FIG. 2) may be formed later in the additional second opening.

A first spacer film (not shown) may be formed on the sidewall of the first opening and the first upper interlayer insulating layer 160. Thereafter, the first spacer film (not shown) formed on the bottom of the first opening is removed through an anisotropic etching process to form a first spacer (not shown), and the upper surface of the base insulating pattern 116 of the cell array area CAA and the base insulation layer 118 of the extension area EA may be exposed.

The first opening may be extended downward by removing the exposed the base insulating pattern 116, the base sacrificial layer 112 lying thereunder and the base insulation layer 118. Through the expanded first opening, the lower filled insulation layer 110 of the substrate 101 on which peripheral circuit area PCA is formed may be exposed, or when a separate support layer or a substrate is additionally interposed as described above, such a support layer or substrate may be exposed.

The base sacrificial layer 112 exposed through the extended first opening may be removed through a wet etching process. At this time, because the sidewall of the first opening is covered by a first spacer (not shown), the sacrificial layer SL and the additional sacrificial layer SLa included in the mold structure may not be removed.

Due to the removal of the base sacrificial layer 112, some sidewalls of the data storage pattern VP of the channel structure CS may be exposed. The exposed data storage pattern VP may also be removed through the wet etching process, so that the part of the sidewall of the semiconductor pattern SP of the channel structure CS may be exposed.

Thereafter, a common source plate CSP may be formed in the gap formed by removing the base sacrificial layer 112. The CSP may include, for example, polysilicon doped with an N-type impurity.

Referring to FIG. 3, in the non-volatile memory device 100 of an example embodiment, the CSP may be formed to be connected to the semiconductor pattern SP of the channel structure CS.

After that, the sidewall of the sacrificial layer SL and the additional sacrificial layer SLa may be exposed again by removing the first spacer in the first opening. Subsequently, the sacrificial layer SL and the additional sacrificial layer SLa exposed through the first opening may be removed. The sacrificial layer SL and the additional sacrificial layer SLa may be removed by isotropic etching using an etching solution having etching selectivity for the interlayer insulating layer ILD and the channel structure CS. For example, when the sacrificial layer SL and the additional sacrificial layer SLa are formed of a silicon nitride and the interlayer insulating layer ILD is a silicon oxide layer, the isotropic etching process may be performed using an etching solution including phosphoric acid to remove the sacrificial layer SL and the additional sacrificial layer Sla.

Through the removal process of the sacrificial layer SL and the additional sacrificial layer SLa, the sacrificial layer SL of the cell array area CAA, the sacrificial layer SL, the additional sacrificial layer Sla, and the first and second sacrificial sealing patterns 146 and 148 of the extension area EA may be removed.

Referring to FIG. 4B, after removing the sacrificial layer SL, the additional sacrificial layer SLa, and the first and second sacrificial sealing patterns 146 and 148, a blocking layer (not shown) is formed on the removed part and a first conductive layer (not shown) may be formed on the blocking layer (not shown).

The blocking layer may include, for example, metal oxide such as aluminum oxide. The first conductive layer may include a barrier layer and a metal layer. The barrier layer may be formed of, for example, TIN, TaN, or WN, and the metal layer may be formed of, for example, W. However, the materials of the blocking layer, the barrier layer, and the metal layer are not limited to the above-described materials.

After that, the first conductive layer on an interior wall of the first opening may be removed by the anisotropic etching. After the anisotropic etching, the first conductive layer remaining between the interlayer insulating layers ILD may constitute the gate electrode layer EL, and the first conductive layer remaining in the extension area EA may constitute the electrode pad ELp. In addition, the blocking layer remaining through the etching process may form the blocking pattern 133.

The entire process of removing the sacrificial layer SL and replacing it with the gate electrode layer EL is referred to as the gate electrode layer replacement process. In the method for fabricating the non-volatile memory device 100 of another example embodiment, by forming the gate electrode layer EL through the gate electrode layer replacement process, the stacking structure SST may be formed in the cell array area CAA and the extension area EA. Also, when the gate electrode layer EL is formed, the electrode pad ELp may be formed on the stair structure of the extension area EA. The electrode pad ELp may be formed by replacing the portion of the sacrificial layer SL and the additional sacrificial layer SLa with the first conductive layer.

The stacking structure SST may be formed in a plurality along the second direction (the y direction), and may be disposed to be spaced apart from each other in the second direction (the y direction) by the first opening (corresponding to the division area DA). The stacking structure SST may include a gate electrode layer EL sequentially formed along a third direction (the z direction). Among a plurality of gate electrode layers EL, the gate electrode layer EL disposed in the lowest layer may serve as a ground selection line GSL, and the gate electrode layer EL disposed in the uppermost layer and the lower layer may serve as a string selection line SSL, while the gate electrode layer EL disposed between them may serve as a word line.

Subsequently, an insulating spacer IS may be formed in the first opening. The insulating spacer may be formed of, for example, a silicon oxide.

Thereafter, a second upper interlayer insulating layer 170 may be formed on the first upper interlayer insulating layer 160, and through an etching process using an etching mask, the first and second upper interlayer insulating layers 160 and 170 may be penetrated to expose the first sacrificial patterns 122, respectively. Thereafter, the exposed first sacrificial patterns 122 may be removed through a wet etching process, for example.

Referring to FIG. 9F and FIG. 4B, after the removal of the first sacrificial patterns 122 or in the removal process, the part of the preliminary separation insulation pattern 121 may also be removed. For example, a connecting portion of the preliminary separation insulation pattern 121 filled in the gap in the third direction (the z direction) between the inner protruding portion PPL of the electrode pad ELp and the planarization insulation layer 150 or filled in the gap in the third direction (the z direction) between the inner protruding portion PPL of the electrode pad ELp and the interlayer insulating layer ILD, and a portion of the preliminary separation insulation pattern 121 filled in the gap between the interlayer insulating layers ILD is removed, and portions of the preliminary separation insulation pattern 121 only filled in the gaps may remain as the separation insulation patterns 120 and 120'. In detail, the preliminary separation insulation pattern 121 filled in the gap in the third direction (the z direction) between the inner protruding portion PPL of the electrode pad ELp and the planarization insulation layer 150 or the gap in the third direction (the z direction) between the inner protruding portion PPL and the interlayer insulating layer ILD of the electrode pad ELp may not be removed and remains as the separation insulation pattern 120', and the preliminary separation insulation pattern 121 filled in the gap between the interlayer insulating layers ILD may also not be removed and remains as the separation insulation pattern 120. This process may be referred to as a node division process.

The portion of the blocking pattern 133 formed on the sidewall of the electrode pad ELp exposed due to the removal of the preliminary separation insulation pattern 121 may also be removed, so that the sidewall of each electrode pad ELp may be exposed.

Next, referring to FIG. 3 and FIG. 4B, by filling the first hole H1 with the second conductive layer, a vertical through contact VC that electrically connects one electrode pad ELp and the peripheral circuit wire ICL may be formed.

Referring to FIG. 3, the first vertical through contact VC passes through the first electrode pad ELp and the second gate electrode layer EL, may be electrically in contact with the first electrode pad ELp, and electrically insulated from the rest of the second gate electrode layer EL by the separation insulation pattern 120. Meanwhile, referring to FIG. 3, because no CSP is formed in the extension area EA of the substrate 101, the vertical through contact VC may be electrically insulated from the CSP.

After forming the vertical through contact VC, the non-volatile memory device 100 may be manufactured by forming the above-described bit line contact plugs BCP, sub-bit lines SBL, and bit lines BL.

Figure 10:
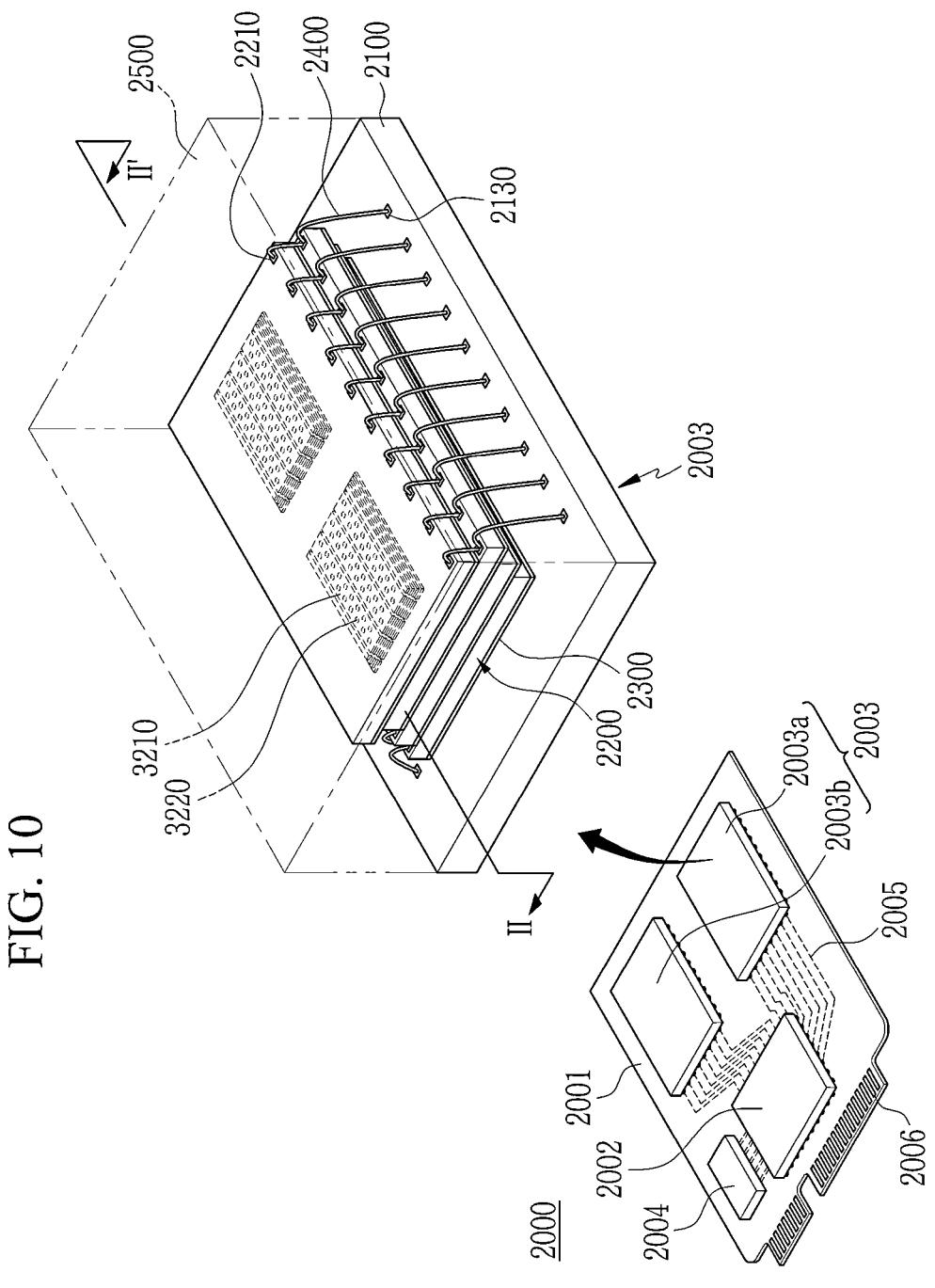
FIG. 10 is a perspective view schematically illustrating an electronic system including a semiconductor device according to an example embodiment.

FIG. 10 is a perspective view schematically showing an electronic system including a semiconductor device according to an example embodiment of the present disclosure.

Referring to FIG. 10, an electronic system 2000 according to an example embodiment of the present disclosure may include a main substrate 2001, and a controller 2002, at least one semiconductor package 2003, and a DRAM 2004, which are mounted on the main substrate 2001. The semiconductor package 2003 and the DRAM 2004 may be connected to the controller 2002 by wire patterns 2005 disposed on the main substrate 2001.

The main substrate 2001 may include a connector 2006 including a plurality of pins coupled to an external host. The number and arrangement of the plurality of pins in the connector 2006 may vary depending on a communication interface between the electronic system 2000 and an external host. In some example embodiments, the electronic system 2000 may communicate with the external host according to any one of interfaces such as USB (Universal Serial Bus), PCI-Express (Peripheral Component Interconnect Express), SATA (Serial Advanced Technology Attachment), UFS (Universal Flash Storage) M-Phy, and the like. In some example embodiments, the electronic system 2000 may be operated by power supplied from an external host through the connector 2006. The electronic system 2000 may further include a power management integrated circuit (PMIC) that distributes power supplied from the external host to the controller 2002 and the semiconductor package 2003.

The controller 2002 may write data to the semiconductor package 2003 or read data from the semiconductor package 2003, and may improve the operation speed of the electronic system 2000.

The DRAM 2004 may be a buffer memory for mitigating a speed difference between the semiconductor package 2003, which is a data storage space, and an external host. The DRAM 2004 included in the electronic system 2000 may also operate as a kind of a cache memory, and may provide a space for temporarily storing the data in the control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may each be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on each bottom surface of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a flexible printed circuit (FPC) including package upper pads 2130. Each semiconductor chip 2200 may include an input and output pad 2210. The input and output pad 2210 may correspond to the input and output pad 1101 of FIG. 1. Each of semiconductor chips 2200 may include gate stacking structures 3210 and memory channel structures 3220. Each of the semiconductor chips 2200 may include the non-volatile memory device as above-described with reference to FIG. 2 to FIG. 9F.

In some example embodiments, the connection structure 2400 may be a bonding wire electrically connecting the input and output pad 2210 and the package upper pads 2130. Accordingly, in each of the first and second semiconductor packages 2003a and 2003b, the semiconductor chips 2200 may be electrically connected to each other by using a bonding wire method, and may be electrically connected to the package upper pads 2130 of the package substrate 2100. According to some example embodiments, in each of the first and second semiconductor packages 2003a and 2003b, the semiconductor chips 2200 may be electrically connected to each other by a connection structure including a through electrode (a through silicon via, TSV) instead of the bonding wire type of connection structure 2400.

In some example embodiments, the controller 2002 and the semiconductor chips 2200 may be included in one package. In an example embodiment, the controller 2002 and the semiconductor chips 2200 may be mounted on a separate interposer substrate different from the main substrate 2001, and the controller 2002 and the semiconductor chips 2200 may be connected to each other by a wire formed on the interposer substrate.

Figure 11:
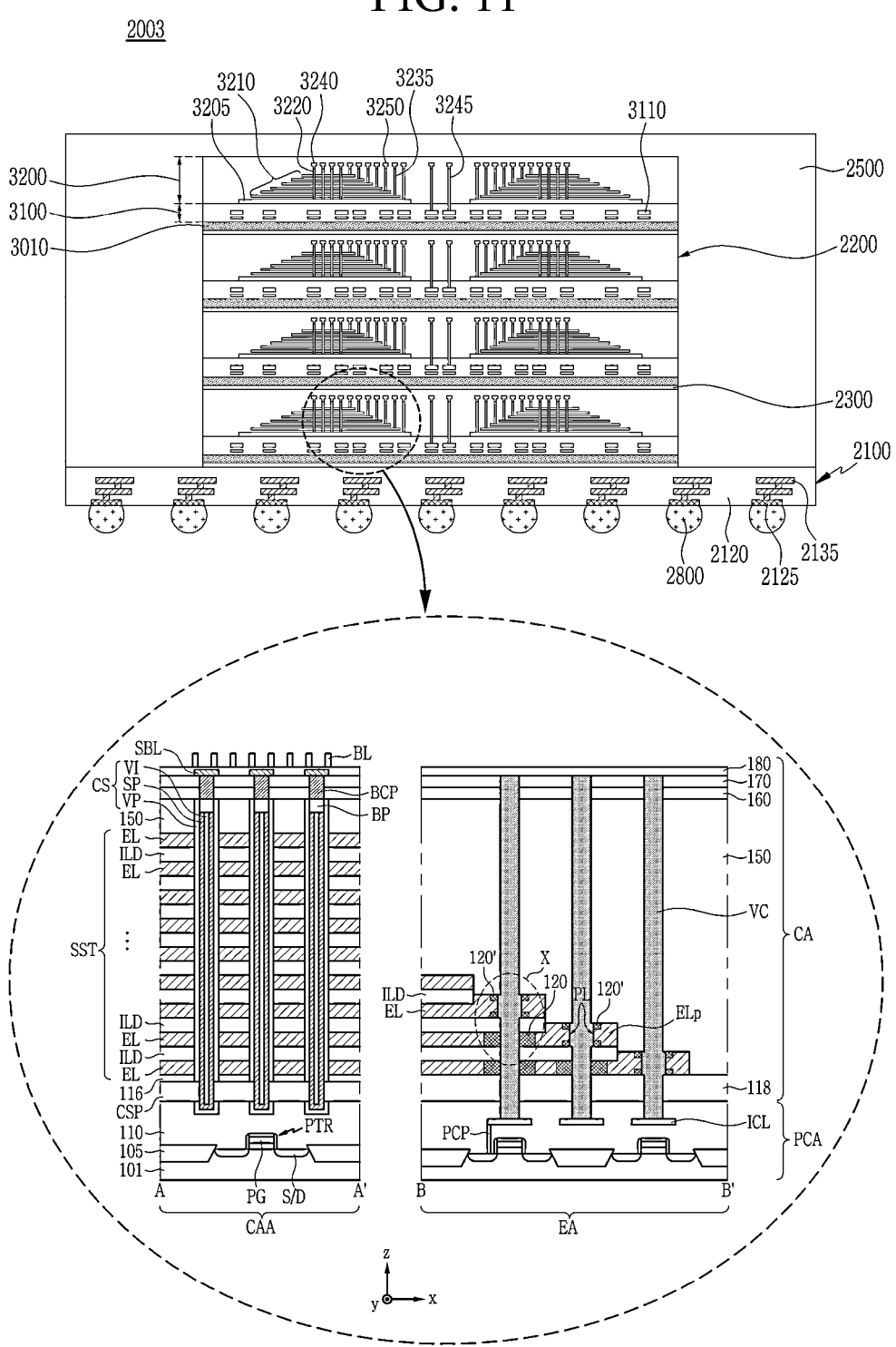
FIG. 11 is a cross-sectional view schematically illustrating a semiconductor package according to an example embodiment.

FIG. 11 is a cross-sectional view schematically showing semiconductor packages according to an example embodiment of the present disclosure. FIG. 11 describes an example embodiment of the semiconductor package 2003 of FIG. 10, and conceptually represents an area obtained by cutting the semiconductor package 2003 of FIG. 10 along a cutting line II-II'.

Referring to FIG. 11, in the semiconductor package 2003, a package substrate 2100 may be a flexible printed circuit (FPC). The package substrate 2100 may include a package substrate body part 2120, package upper pads (2130 of FIG. 10) disposed on the upper surface of the package substrate body part 2120, lower pads 2125 disposed on the lower surface of the package substrate body part 2120 or exposed through the lower surface, and inner wires 2135 electrically connecting the upper pads 2130 and the lower pads 2125 inside the package substrate body part 2120. The upper pads 2130 may be electrically connected to connection structures (2400 of FIG. 10). The lower pads 2125 may be connected to wire patterns 2005 of the main substrate 2001 of the electronic system 2000 like FIG. 10 through conductive connections.

Each of the semiconductor chips 2200 may include a first structure 3100 and a second structure 3200 sequentially stacked on the semiconductor substrate 3010. The first structure 3100 may include a peripheral circuit area including peripheral wires 3110. The second structure 3200 may include a common source line 3205, a gate stacking structure 3210 on the common source line 3205, memory channel structures 3220 and division structures penetrating the gate stacking structure 3210, bit lines 3240 electrically connected to the memory channel structures 3220, and gate connection wires 3235 electrically connected to word lines (WL of FIG. 1) of the gate stacking structure 3210.

Referring to FIG. 11 and FIG. 3 as an enlarged view of FIG. 11, the first structure 3100 and the second structure 3200 correspond to the peripheral circuit area PCA and the cell area CA of the enlarged view (FIG. 3). The peripheral wires 3110 of the first structure 3100 correspond to the peripheral circuit wire ICL in the enlarged view. The common source line 3205 of the second structure 3200 corresponds to the common source plate CSP in the enlarged view. In the second structure 3200, the common source line 3205 is shown to be formed in the entire area under the gate stacking structure 3210, but as shown in the enlarged view, the common source plate CSP may be formed only in the cell array area CAA, and the base insulation layer 118 may be formed in the extension area EA. The gate stacking structure 3210 on the common source line 3205 corresponds to the stacking structure SST in the enlarged view. The memory channel structures 3220 penetrating the gate stacking structure 3210 correspond to the channel structures CS in the enlarged view. Although not shown in FIG. 11, the division structures penetrating the gate stacking structure 3210 correspond to the division area DA of FIG. 2. The bit lines 3240 electrically connected to the memory channel structures 3220 correspond to the bit lines BL in the enlarged view. The gate connection wires 3235 electrically connected to the word lines of the gate stacking structure 3210 correspond to the vertical through contact VC in the enlarged view. As shown in the enlarged view, the vertical through contact VC may pass through the stacking structure SST and be directly connected to the peripheral circuit wire ICL of the peripheral circuit area PCA. Accordingly, FIG. 11 shows a junction structure 3250 on the gate connection wires 3235, but because the gate connection wires 3235 pass through the gate stacking structure 3210 and directly contact the peripheral wires 3110 of the first structure 3100, the junction structure 3250 may be omitted.

Each of the semiconductor chips 2200 may include a through wire 3245 electrically connected to the peripheral wires 3110 of the first structure 3100 and extending into the second structure 3200. The through wire 3245 may be disposed outside the gate stacking structure 3210, and may be further disposed to pass through the gate stacking structure 3210. Each of the semiconductor chips 2200 may further include an input and output pad (2210 of FIG. 10) electrically connected to the peripheral wires 3110 of the first structure 3100.

The semiconductor chips 2200 of FIG. 11 may be electrically connected to each other by connection structures 2400 in a form of bonding wires. However, in some example embodiments, the semiconductor chips within one semiconductor package, such as the semiconductor chips 2200 of FIG. 11, may be electrically connected to each other by a connection structure including the through electrode TSV.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While this disclosure has been described in connection with what is presently considered to be some practical example embodiments, it is to be understood that the disclosure is not limited to the disclosed example embodiments. On the contrary, it is intended to cover various modifications and equivalent arrangements included within the spirit and scope of the appended claims.

What is claimed is:

1. A non-volatile memory device comprising:
gate electrode layers spaced apart from each other on a substrate along a direction perpendicular to an upper surface of the substrate and stacked in a stair shape, the gate electrode layers including a first gate electrode layer and a second gate electrode layer under the first gate electrode layer;
electrode pads connected to ends of the gate electrode layers, the electrode pads including a first electrode pad connected to the first gate electrode layer;
a channel structure penetrating the gate electrode layers;
a first vertical through contact electrically connected to the first electrode pad by penetrating the first electrode pad connected to the first gate electrode layer and penetrating the second gate electrode layer; and
a separation insulation pattern including a first portion and a second portion, the first portion interposed between the first vertical through contact and a portion of a first sidewall of the first electrode pad such that the first vertical through contact and the first electrode pad are electrically connected with each other, the second portion interposed between the first vertical through contact and a second sidewall of the second gate electrode layer to electrically insulate the first vertical through contact from the second gate electrode layer,
wherein a height of a contact portion where the first electrode pad contacts the first vertical through contact is less than a height of the first electrode pad.

2. The non-volatile memory device of claim 1, wherein each of the electrode pads is thicker than a corresponding one of the gate electrode layers that is connected thereto.

3. The non-volatile memory device of claim 1, wherein the first electrode pad includes an inner protruding portion on a sidewall thereof facing the first vertical through contact, the inner protruding portion protruding in a direction parallel to the upper surface of the substrate toward a sidewall of the first vertical through contact.

4. The non-volatile memory device of claim 3, wherein the separation insulation pattern is on at least one of an upper surface or a lower surface of the inner protruding portion of the first electrode pad.

5. The non-volatile memory device of claim 3, wherein the separation insulation pattern includes
a first separation insulation pattern on an upper surface of the inner protruding portion, and
a second separation insulation pattern on a lower surface of the inner protruding portion.

6. The non-volatile memory device of claim 1, wherein the separation insulation pattern includes silicon oxide.

7. The non-volatile memory device of claim 1, further comprising:
a blocking pattern covering an upper surface, a lower surface, and at least a part of a sidewall of each of the gate electrode layers and each of the electrode pads,
wherein the blocking pattern is not on the sidewall of the first electrode pad facing the first vertical through contact, and is on the sidewall of the second gate electrode layer facing the first vertical through contact.

8. The non-volatile memory device of claim 1, wherein a first width of the second portion of the separation insulation pattern in a direction parallel to the upper surface of the substrate is greater than a first height of the second gate electrode layer in the direction perpendicular to the upper surface of the substrate.

9. The non-volatile memory device of claim 1, wherein an upper end of the first vertical through contact is not connected to a wire, and a bottom end of the first vertical through contact is connected to a peripheral circuit pattern underneath.

10. The non-volatile memory device of claim 1, further comprising:

a peripheral circuit pattern formed in a cell array area and an extension area, the cell array area and the extension area being side by side in a direction parallel to the upper surface of the substrate;

a lower filled insulation layer covering the peripheral circuit pattern;

a common source plate in the cell array area and on the lower filled insulation layer; and a base insulation layer in the extension area and on the lower filled insulation layer.

11. The non-volatile memory device of claim 10, wherein the gate electrode layers overlap at least a part of the common source plate in the direction perpendicular to the upper surface of the substrate.

12. The non-volatile memory device of claim 10, wherein the first vertical through contact is electrically connected to the peripheral circuit pattern by penetrating the base insulation layer and the lower filled insulation layer.

13. The non-volatile memory device of claim 10, wherein the channel structure includes a semiconductor pattern, a filled insulating pattern filling inside the semiconductor pattern, and a data storage pattern surrounding a part of a sidewall of the semiconductor pattern.

14. The non-volatile memory device of claim 13, wherein the common source plate penetrates at least a part of the data storage pattern to be in contact with the sidewall of the semiconductor pattern.

15. A method for fabricating a non-volatile memory device, comprising:

forming a mold structure by alternately stacking a sacrificial layer and an interlayer insulating layer along a first direction perpendicular to an upper surface of a substrate on a cell array area and an extension area, the cell array area and the extension area being side by side in a second direction parallel to the upper surface of the substrate, the mold structure including a plurality of sacrificial layers;

forming a stair structure by performing a trimming process on the mold structure;

forming additional sacrificial layers on corresponding ones of the plurality of sacrificial layers included in the mold structure that are exposed by the stair structure;

forming a channel structure penetrating the mold structure in the cell array area;

forming a first hole penetrating a first additional sacrificial layer from among the additional sacrificial layers, and a second sacrificial layer under the first additional sacrificial layer from among the additional sacrificial layers;

partially removing the plurality of sacrificial layer and the additional sacrificial layer exposed by the first hole to define recesses along the second direction, the recesses including a first recess in which the sacrificial layer is exposed and a second recess in which both the additional sacrificial layer and the sacrificial layer are exposed;

forming first and second sacrificial sealing layers having different etch rates in the recesses so that the first sacrificial sealing layer is formed in the first recess, and the first and second sacrificial sealing layers are formed in the second recess;

partially removing the first and second sacrificial sealing layers such that the first sacrificial sealing layer positioned within the first recess is removed, and the first and second sacrificial sealing layers positioned within the second recess are partially removed to form first and second sacrificial sealing patterns;

forming a preliminary separation insulation pattern and a first sacrificial pattern by depositing and planarizing a separation insulation layer and a first sacrificial layer inside the first hole in which the first and second sacrificial sealing patterns are formed;

replacing the first and second sacrificial sealing patterns, the sacrificial layer, and the additional sacrificial layer with a gate electrode layer and an electrode pad; and removing the first sacrificial pattern in the first hole and removing a part of the preliminary separation insulation pattern to form a separation insulation pattern in the second recess where the electrode pad exists and the first recess where the gate electrode layer exists and filling the first hole with a conductive layer to form a vertical through contact.

16. The method of claim 15, wherein an etch rate of the first sacrificial sealing layer is higher than an etch rate of the second sacrificial sealing layer.

17. The method of claim 15, wherein the first sacrificial sealing layer includes silicon nitride, and the second sacrificial sealing layer includes silicon oxynitride.

18. The method of claim 15, wherein in the forming of the first and second sacrificial sealing layers, the first and second sacrificial sealing layers are sequentially formed, and the first sacrificial sealing layer is formed to a thickness that entirely fills the first recess.

19. An electronic system comprising:

a main substrate;

a semiconductor device on the main substrate; and a controller electrically connected to the semiconductor device on the main substrate, wherein the semiconductor device includes, a non-volatile memory device including a peripheral circuit pattern, the peripheral circuit pattern being in a cell array area and an extension area, the cell array area and the extension area being side by side in a horizontal direction on an upper surface of a substrate, and an input and output pad electrically connected to the peripheral circuit pattern of the non-volatile memory device, and wherein the non-volatile memory device further includes, gate electrode layers spaced apart from each other on the substrate along a direction perpendicular to the upper surface of the substrate, which includes the peripheral circuit pattern, the gate electrode layers stacked in a stair shape, the gate electrode layers including a first gate electrode layer and a second gate electrode layer under the first gate electrode layer, electrode pads connected to ends of the gate electrode layers, the electrode pads including a first electrode pad connected to the first gate electrode layer, a channel structure penetrating the gate electrode layers, a first vertical through contact electrically connected to the first electrode pad by penetrating the first electrode pad connected to the first gate electrode layer, and the first vertical through contact penetrating the second gate electrode layer to be electrically connected to the peripheral circuit pattern and to be insulated from the second gate electrode layer, and a separation insulation pattern including a first portion and a second portion, the first portion interposed between the first vertical through contact and a portion of a first sidewall of the first electrode pad such that the first vertical through contact and the first electrode pad are electrically connected with each other, the second portion interposed between the first vertical through contact and a second sidewall of the second gate electrode layer to electrically insulate the first vertical through contact from the second gate electrode layer, wherein a height of a contact portion where the first electrode pad contacts the first vertical through contact is less than a height of the first electrode pad.

20. The electronic system of claim 19, wherein the non-volatile memory device further includes:

a lower filled insulation layer covering the peripheral circuit pattern;

a common source plate in the cell array area and on the lower filled insulation layer; and a base insulation layer in the extension area and on the lower filled insulation layer, wherein the gate electrode layers overlap at least a part of the common source plate in a direction perpendicular to the upper surface of the substrate.

\* \* \* \* \*